(12) United States Patent
Yasuda et al.

(10) Patent No.: US 12,438,519 B2
(45) Date of Patent: Oct. 7, 2025

(54) METHODS OF MANUFACTURING MULTI-BAND SURFACE ACOUSTIC WAVE FILTERS

(71) Applicant: Skyworks Solutions, Inc., Irvine, CA (US)

(72) Inventors: Takanori Yasuda, Nara (JP); Ousmane I Barry, Settsu (JP); Keiichi Maki, Suita (JP); Hiroyuki Nakamura, Osaka-Fu (JP)

(73) Assignee: Skyworks Solutions, Inc., Irvine, CA (US)

(*) Notice: Subject to any disclaimer, the term of this patent is extended or adjusted under 35 U.S.C. 154(b) by 349 days.

(21) Appl. No.: 18/061,945

(22) Filed: Dec. 5, 2022

(65) Prior Publication Data

US 2023/0216482 A1    Jul. 6, 2023

Related U.S. Application Data

(60) Provisional application No. 63/286,310, filed on Dec. 6, 2021.

(51) Int. Cl.
| | | |
|---|---|---|
| *H03H 9/25* | (2006.01) | |
| *H03H 3/02* | (2006.01) | |
| *H03H 3/08* | (2006.01) | |
| *H03H 9/64* | (2006.01) | |
| *H03H 9/72* | (2006.01) | |

(52) U.S. Cl.
CPC .............. *H03H 9/25* (2013.01); *H03H 3/02* (2013.01); *H03H 3/08* (2013.01); *H03H 9/6433* (2013.01); *H03H 9/6483* (2013.01); *H03H 9/725* (2013.01)

(58) Field of Classification Search
CPC .......... H03H 9/6433; H03H 9/25; H03H 3/02; H03H 3/08
USPC ......................................... 333/186, 190–193
See application file for complete search history.

(56) References Cited

U.S. PATENT DOCUMENTS

| | | |
|---|---|---|
| 5,990,762 A | 11/1999 | Nakamura et al. |
| 6,104,260 A | 8/2000 | Yamada et al. |
| 6,348,845 B2 | 2/2002 | Nakamura et al. |
| 6,351,196 B1 | 2/2002 | Nakamura et al. |
| 6,476,691 B1 | 11/2002 | Tsuzuki et al. |
| 6,650,206 B2 | 11/2003 | Nakamura et al. |
| 6,674,345 B2 | 1/2004 | Nakamura et al. |

(Continued)

OTHER PUBLICATIONS

US 11,929,728 B2, 03/2024, Maki et al. (withdrawn)

*Primary Examiner* — Rakesh B Patel
(74) *Attorney, Agent, or Firm* — Knobbe, Martens, Olson & Bear, LLP

(57) ABSTRACT

A method of manufacturing a packaged surface acoustic wave filter chip is disclosed. The method can include providing a structure having first interdigital transducer electrodes formed with a first piezoelectric layer, second interdigital transducer electrodes formed with a second piezoelectric layer, and a substrate between the first and second piezoelectric layers. The method can include forming a plurality of through electrodes extending at least partially through a thickness of the structure such that a first set of through electrodes of the plurality of through electrodes are electrically connected to the first interdigital transducer electrodes and a second set of through electrodes of the plurality of through electrodes are electrically isolated from the first interdigital transducer electrodes.

20 Claims, 30 Drawing Sheets

(56) References Cited

U.S. PATENT DOCUMENTS

| | | |
|---|---|---|
| 6,683,515 B1 | 1/2004 | Nakamura et al. |
| 6,710,683 B2 | 3/2004 | Nakamura et al. |
| 6,801,100 B2 | 10/2004 | Nakamura et al. |
| 6,806,619 B2 | 10/2004 | Nakamura et al. |
| 6,809,611 B2 | 10/2004 | Ishizaki et al. |
| 6,853,269 B2 | 2/2005 | Nakamura et al. |
| 6,870,302 B2 | 3/2005 | Nakamura et al. |
| 6,882,250 B2 | 4/2005 | Uriu et al. |
| 6,891,450 B2 | 5/2005 | Nakamura et al. |
| 6,900,705 B2 | 5/2005 | Nakamura et al. |
| 6,930,570 B2 | 8/2005 | Nakamura et al. |
| 6,972,643 B2 | 12/2005 | Tsunekawa et al. |
| 6,975,180 B2 | 12/2005 | Nakamura et al. |
| 7,012,480 B2 | 3/2006 | Nakamura et al. |
| 7,019,435 B2 | 3/2006 | Nakaya et al. |
| 7,034,634 B2 | 4/2006 | Nakamura et al. |
| 7,034,635 B2 | 4/2006 | Nakamura et al. |
| 7,046,102 B2 | 5/2006 | Nakamura et al. |
| 7,075,391 B2 | 7/2006 | Nakamura et al. |
| 7,138,890 B2 | 11/2006 | Nakamura et al. |
| 7,176,768 B2 | 2/2007 | Nakamura et al. |
| 7,224,240 B2 | 5/2007 | Nakamura et al. |
| 7,301,420 B2 | 11/2007 | Yamaguchi et al. |
| 7,446,629 B2 | 11/2008 | Nakamura et al. |
| 7,498,898 B2 | 3/2009 | Nakanishi et al. |
| 7,501,917 B2 | 3/2009 | Nishimura et al. |
| 7,579,931 B2 | 8/2009 | Nakamura et al. |
| 7,701,311 B2 | 4/2010 | Nakamura et al. |
| 7,812,688 B2 | 10/2010 | Nakamura et al. |
| 7,898,360 B2 | 3/2011 | Mitani et al. |
| 7,939,988 B2 | 5/2011 | Goto et al. |
| 7,965,155 B2 | 6/2011 | Nakamura et al. |
| 7,982,365 B2 | 7/2011 | Goto et al. |
| 8,035,460 B2 | 10/2011 | Nakanishi et al. |
| 8,072,293 B2 | 12/2011 | Nakamura et al. |
| 8,084,915 B2 | 12/2011 | Hamaoka et al. |
| 8,084,916 B2 | 12/2011 | Goto et al. |
| 8,154,171 B2 | 4/2012 | Nakamura et al. |
| 8,174,165 B2 | 5/2012 | Nakanishi et al. |
| 8,330,553 B2 | 12/2012 | Tsurunari et al. |
| 8,368,486 B2 | 2/2013 | Tsurunari et al. |
| 8,384,495 B2 | 2/2013 | Fujiwara et al. |
| 8,410,865 B2 | 4/2013 | Jibu et al. |
| 8,427,259 B2 | 4/2013 | Fujiwara et al. |
| 8,436,778 B2 | 5/2013 | Fujiwara et al. |
| 8,476,991 B2 | 7/2013 | Goto et al. |
| 8,482,184 B2 | 7/2013 | Goto et al. |
| 8,482,363 B2 | 7/2013 | Fujiwara et al. |
| 8,487,720 B2 | 7/2013 | Fujiwara et al. |
| 8,531,252 B2 | 9/2013 | Nakamura et al. |
| 8,564,172 B2 | 10/2013 | Seki et al. |
| 8,576,025 B2 | 11/2013 | Inoue et al. |
| 8,598,968 B2 | 12/2013 | Seo et al. |
| 8,618,992 B2 | 12/2013 | Fujiwara et al. |
| 8,669,832 B2 | 3/2014 | Kamiguchi et al. |
| 8,686,809 B2 | 4/2014 | Fujiwara et al. |
| 8,698,578 B2 | 4/2014 | Nakanishi et al. |
| 8,704,612 B2 | 4/2014 | Tsurunari et al. |
| 8,994,472 B2 | 3/2015 | Yamaji et al. |
| 9,035,725 B2 | 5/2015 | Komatsu et al. |
| 9,041,486 B2 | 5/2015 | Tsurunari et al. |
| 9,048,813 B2 | 6/2015 | Iwasaki et al. |
| 9,065,424 B2 | 6/2015 | Nakanishi et al. |
| 9,083,314 B2 | 7/2015 | Tsurunari et al. |
| 9,099,634 B2 | 8/2015 | Inoue et al. |
| 9,118,302 B2 | 8/2015 | Shimizu et al. |
| 9,124,240 B2 | 9/2015 | Shimizu et al. |
| 9,136,458 B2 | 9/2015 | Komatsu et al. |
| 9,166,558 B2 | 10/2015 | Fujiwara et al. |
| 9,203,376 B2 | 12/2015 | Tsurunari et al. |
| 9,203,378 B2 | 12/2015 | Fujiwara et al. |
| 9,246,533 B2 | 1/2016 | Fujiwara et al. |
| 9,294,071 B2 | 3/2016 | Yamaji et al. |
| 9,413,330 B2 | 8/2016 | Shimizu et al. |
| 9,419,584 B2 | 8/2016 | Tsurunari et al. |
| 9,425,766 B2 | 8/2016 | Fujiwara et al. |
| 9,467,117 B2 | 10/2016 | Fujiwara et al. |
| 9,473,107 B2 | 10/2016 | Komatsu et al. |
| 9,496,846 B2 | 11/2016 | Iwasaki et al. |
| 9,520,857 B2 | 12/2016 | Fujiwara et al. |
| 9,614,495 B2 | 4/2017 | Hamaoka et al. |
| 9,628,047 B2 | 4/2017 | Miyanari et al. |
| 9,634,644 B2 | 4/2017 | Iwasaki et al. |
| 9,640,750 B2 | 5/2017 | Nakanishi et al. |
| 9,647,635 B2 | 5/2017 | Nakamura et al. |
| 9,722,573 B2 | 8/2017 | Fujiwara et al. |
| 9,722,576 B2 | 8/2017 | Fujiwara et al. |
| 9,748,924 B2 | 8/2017 | Komatsu et al. |
| 9,819,329 B2 | 11/2017 | Tsurunari et al. |
| 10,044,340 B2 | 8/2018 | Fujiwara et al. |
| 10,097,159 B2 | 10/2018 | Komatsu et al. |
| 10,135,422 B2 | 11/2018 | Goto et al. |
| 10,141,643 B2 | 11/2018 | Fujiwara et al. |
| 10,284,171 B2 | 5/2019 | Miyanari et al. |
| 10,305,445 B2 | 5/2019 | Nakamura et al. |
| 10,305,448 B2 | 5/2019 | Iwasaki et al. |
| 10,374,570 B2 | 8/2019 | Iwasaki et al. |
| 10,389,326 B2 | 8/2019 | Hamaoka et al. |
| 10,439,585 B2 | 10/2019 | Iwasaki et al. |
| 10,476,482 B2 | 11/2019 | Niwa et al. |
| 10,749,497 B2 | 8/2020 | Tang et al. |
| 10,778,181 B2 | 9/2020 | Goto et al. |
| 10,778,183 B2 | 9/2020 | Ando et al. |
| 10,873,311 B2 | 12/2020 | Ando et al. |
| 11,025,220 B2 | 6/2021 | Fukuhara et al. |
| 11,050,406 B2 | 6/2021 | Maki et al. |
| 11,075,616 B2 | 7/2021 | Ando et al. |
| 11,101,787 B2 | 8/2021 | Ando et al. |
| 11,133,789 B2 | 9/2021 | Maki et al. |
| 11,245,378 B2 | 2/2022 | Tang et al. |
| 11,258,429 B2 | 2/2022 | Ando et al. |
| 11,349,454 B2 | 5/2022 | Shin et al. |
| 11,356,075 B2 | 6/2022 | Kadota et al. |
| 11,368,137 B2 | 6/2022 | Goto et al. |
| 11,387,808 B2 | 7/2022 | Shin et al. |
| 11,424,732 B2 | 8/2022 | Shin et al. |
| 11,616,487 B2 | 3/2023 | Nakamura et al. |
| 11,616,491 B2 | 3/2023 | Tang et al. |
| 11,621,690 B2 | 4/2023 | Fukuhara et al. |
| 11,664,780 B2 | 5/2023 | Goto et al. |
| 11,671,072 B2 | 6/2023 | Goto et al. |
| 11,677,377 B2 | 6/2023 | Goto et al. |
| 11,689,178 B2 | 6/2023 | Nakamura et al. |
| 11,722,122 B2 | 8/2023 | Goto et al. |
| 11,750,172 B2 | 9/2023 | Goto et al. |
| 11,750,174 B2 | 9/2023 | Ando et al. |
| 11,804,822 B2 | 10/2023 | Fukuhara et al. |
| 11,824,515 B2 | 11/2023 | Tang et al. |
| 11,863,156 B2 | 1/2024 | Iwasaki et al. |
| 11,876,501 B2 | 1/2024 | Fukuhara et al. |
| 11,881,837 B2 | 1/2024 | Caron et al. |
| 11,894,828 B2 | 2/2024 | Nakamura et al. |
| 11,909,377 B2 | 2/2024 | Caron et al. |
| 11,909,378 B2 | 2/2024 | Caron et al. |
| 11,916,533 B2 | 2/2024 | Kadota et al. |
| 11,923,822 B2 | 3/2024 | Maki et al. |
| 11,923,823 B2 | 3/2024 | Fukuhara et al. |
| 11,996,821 B2 | 5/2024 | Goto et al. |
| 2003/0128081 A1* | 7/2003 | Ella ............... H03H 9/0571 |
| | | 333/133 |
| 2006/0164184 A1 | 7/2006 | Nakamura et al. |
| 2007/0096160 A1 | 5/2007 | Beroz et al. |
| 2010/0156554 A1 | 6/2010 | Nakamura et al. |
| 2013/0026881 A1 | 1/2013 | Okamoto et al. |
| 2016/0226464 A1 | 8/2016 | Fujiwara et al. |
| 2018/0152169 A1 | 5/2018 | Goto et al. |
| 2018/0159494 A1 | 6/2018 | Goto et al. |
| 2019/0074819 A1 | 3/2019 | Goto et al. |
| 2019/0379347 A1 | 12/2019 | Goto et al. |
| 2020/0162053 A1 | 5/2020 | Goto et al. |
| 2021/0159876 A1 | 5/2021 | Maki et al. |
| 2021/0159883 A1 | 5/2021 | Kadota et al. |
| 2021/0281239 A1 | 9/2021 | Maki et al. |
| 2021/0376816 A1 | 12/2021 | Bywalez et al. |

(56) References Cited

U.S. PATENT DOCUMENTS

| | | |
|---|---|---|
| 2022/0255534 A1 | 8/2022 | Barsukou et al. |
| 2022/0271730 A1 | 8/2022 | Abbott et al. |
| 2022/0271733 A1 | 8/2022 | Abbott et al. |
| 2022/0271734 A1 | 8/2022 | Abbott et al. |
| 2022/0286105 A1 | 9/2022 | Goto et al. |
| 2022/0368311 A1 | 11/2022 | Shin et al. |
| 2022/0399867 A1 | 12/2022 | Goto et al. |
| 2022/0399871 A1 | 12/2022 | Goto et al. |
| 2022/0407496 A1 | 12/2022 | Hill et al. |
| 2023/0013597 A1 | 1/2023 | Goto et al. |
| 2023/0031568 A1 | 2/2023 | Tang et al. |
| 2023/0062981 A1 | 3/2023 | Fukuhara et al. |
| 2023/0066822 A1 | 3/2023 | Fukuhara et al. |
| 2023/0069327 A1 | 3/2023 | Fukuhara et al. |
| 2023/0094674 A1 | 3/2023 | Barsukou et al. |
| 2023/0099440 A1 | 3/2023 | Barsukou et al. |
| 2023/0104257 A1 | 4/2023 | Barsukou et al. |
| 2023/0105726 A1 | 4/2023 | Tang et al. |
| 2023/0105794 A1 | 4/2023 | Barsukou et al. |
| 2023/0107376 A1 | 4/2023 | Goto et al. |
| 2023/0110477 A1 | 4/2023 | Maki et al. |
| 2023/0111849 A1 | 4/2023 | Maki et al. |
| 2023/0112443 A1 | 4/2023 | Barsukou et al. |
| 2023/0112677 A1 | 4/2023 | Tang et al. |
| 2023/0179171 A1 | 6/2023 | Yasuda et al. |
| 2023/0208376 A1 | 6/2023 | Goto et al. |
| 2023/0208389 A1 | 6/2023 | Goto et al. |
| 2023/0283255 A1 | 9/2023 | Nakamura et al. |
| 2023/0308081 A1 | 9/2023 | Tang et al. |
| 2023/0318566 A1 | 10/2023 | Yasuda et al. |
| 2023/0336159 A1 | 10/2023 | Hiramatsu et al. |
| 2023/0343659 A1 | 10/2023 | Yasuda et al. |
| 2023/0345182 A1 | 10/2023 | Yasuda et al. |
| 2023/0345648 A1 | 10/2023 | Yasuda et al. |
| 2023/0361753 A1 | 11/2023 | Yasuda et al. |
| 2023/0370044 A1 | 11/2023 | Goto et al. |
| 2023/0378930 A1 | 11/2023 | Goto et al. |
| 2023/0396233 A1 | 12/2023 | Nakamura et al. |
| 2023/0396235 A1 | 12/2023 | Nakamura et al. |
| 2024/0063775 A1 | 2/2024 | Ando et al. |

\* cited by examiner

METHODS OF MANUFACTURING MULTI-BAND SURFACE ACOUSTIC WAVE FILTERS

BACKGROUND

Technical Field

Embodiments of this disclosure relate to smaller-sized surface acoustic wave (SAW) filters used for radio frequency bands and manufacturing methods the same.

Description of Related Technology

Acoustic wave devices such as SAW devices can be used as components for filters in radio frequency electronic systems. For instance, filters in a radio frequency front end of a mobile phone can include acoustic wave filters. Two acoustic wave filters can be arranged as a duplexer.

SUMMARY

One aspect of this disclosure is a surface acoustic wave filter including a substrate, and first and second surface acoustic wave filter structures disposed on a first main surface of the substrate and a second main surface of the substrate opposite to the first main surface, respectively. The first surface acoustic wave filter structure includes a first piezoelectric layer, a plurality of surface acoustic wave resonators formed on a top surface of the first piezoelectric layer, and a wiring layer connecting the plurality of surface acoustic wave resonators to each other. The second surface acoustic wave filter includes first and second piezoelectric layers, a plurality of surface acoustic wave resonators formed on a bottom surface of the second piezoelectric layer, and a wiring layer connecting the plurality of surface acoustic wave resonators to each other, where a plurality of through electrodes extend through the first and second piezoelectric layers. A circuit including the plurality of surface acoustic wave resonators and the wiring layer on the top surface of the first piezoelectric layer forms at least one first radio frequency filter, and a circuit including the plurality of surface acoustic wave resonators and the wiring layer on the top surface of the second piezoelectric layer forms at least one second radio frequency filter. The at least one first radio frequency filter and the at least one second radio frequency filter belong to different frequency bands.

The surface acoustic wave filter can further include dielectric layers formed on the first main surface and the second main surface, respectively, and the first and second piezoelectric layers can be deposited over the first and second main surfaces, respectively, via the respective dielectric layers. The plurality of through electrodes can extend through the dielectric layer.

The surface acoustic wave filter can further include a first cavity roof forming a cavity over the plurality of surface acoustic wave resonators, the wiring layer, and the plurality of through electrodes on the top surface of the first piezoelectric layer, and a second cavity roof forming a cavity over the plurality of surface acoustic wave resonators and the wiring layer on the bottom surface of the second piezoelectric layer.

The surface acoustic wave filter can further include a first cavity frame formed along a periphery of the top surface of the first piezoelectric layer to support the first cavity roof and a second cavity frame formed along a periphery of the top surface of the second piezoelectric layer.

The surface acoustic wave filter can further include another wiring layer formed on a bottom surface of the second piezoelectric layer and the second cavity roof and connected to at least some of the plurality of the through electrodes, a resin layer formed over the other wiring layer, and a packaging terminal formed on a top surface of the resin layer and connected to the other wiring layer.

The other wiring layer can further include a seed layer between the second piezoelectric layer and the second cavity roof. The packaging terminal can be connected to the other wiring layer via a column electrode extending in a thickness direction of the resin layer. The surface acoustic wave filter can further include a solder ball formed on a top surface of the packaging terminal.

The plurality of through electrodes can be formed as a unit of through electrodes adjacently disposed together. The plurality of through electrodes can include a through electrode connected to the wiring layer. The plurality of through electrodes can include a through electrode electrically isolated from the wiring layer.

At least one of the first and second radio frequency filters can include a ladder filter in which a plurality of surface acoustic wave resonators are connected in a ladder configuration and the ladder-type filter can have a passband in a radio frequency band.

Another aspect of this disclosure is a method of manufacturing a surface acoustic wave filter, the method including providing a substrate, depositing a first piezoelectric layer and a second piezoelectric layer over a first main surface of the substrate and a second main surface of the substrate opposite to the first main surface, respectively, forming a plurality of surface acoustic wave resonators and wiring layers each connecting the surface acoustic wave resonators to each other on each of a top surface of the first piezoelectric layer and a bottom surface of the second piezoelectric layer, respectively, forming a plurality of through electrodes extending through the substrate, the first piezoelectric layer, and the second piezoelectric substrate, and forming a cavity over the plurality of surface acoustic wave resonators, the wiring layer, and the plurality of through electrodes on each of the top surface of the first piezoelectric layer and the top surface of the second piezoelectric layer, where a circuit including the plurality of surface acoustic wave resonators and the wiring layer on the top surface of the first piezoelectric layer forms at least one first radio frequency filter, and a circuit including the plurality of surface acoustic wave resonators and the wiring layer on the top surface of the second piezoelectric layer forms at least one second radio frequency filter. The at least one first radio frequency filter and the at least one second radio frequency filter belong to different frequency bands.

Before depositing the first piezoelectric layer and the second piezoelectric layer over the first main surface and the second main surface, respectively, the method can further include forming a dielectric layer over each of the first main surface and the second main surface, and forming the plurality of through electrodes can include forming the plurality of through electrodes extending through the dielectric layers.

Forming the cavity over the plurality of surface acoustic wave resonators and the wiring layer can further include forming a first cavity roof and a second cavity roof covering respective cavities on the top surface of the first piezoelectric layer and the bottom surface of the second piezoelectric layer, respectively, forming another wiring layer connected to at least some of the plurality of through electrodes on the bottom surfaces of the second piezoelectric layer and the second cavity roof, forming a resin layer over the other wiring layer on the bottom surfaces of the second piezoelectric layer and the second cavity roof, and forming a packaging terminal connected to the other wiring layer on a bottom surface of the resin layer.

Forming the first cavity roof can include forming a first cavity frame having a certain height and extending along a periphery of the substrate to enclose the surface acoustic resonators, the wiring layer, and the plurality of through electrodes on the top surface of the first piezoelectric layer, and mounting the first cavity roof to be supported by the first cavity frame.

Forming the second cavity roof can include forming a second cavity frame having a certain height and extending along a periphery of the substrate to enclose the surface acoustic resonators and the wiring layer on the bottom surface of the second piezoelectric layer, and mounting the second cavity roof to be supported by the second cavity frame.

Before forming the other wiring layer, the method can further include forming another seed layer to be connected to at least some of the plurality of through electrodes on the bottom surface of the second piezoelectric layer to cover the second cavity roof, where the other wiring layer can be formed on the other seed layer.

Before forming the resin layer, the method can further include forming a column electrode to be connected to the other wiring layer through the resin layer, where the packaging terminal can be formed on the bottom surface of the column electrode.

Forming the plurality of through electrode can include forming a certain number of through electrodes adjacently disposed together as a single unit. The plurality of through electrodes can include a through electrode connected to the wiring layer. The plurality of through electrodes can include a through electrode electrically isolated from the wiring layer.

Another aspect of this disclosure is a surface acoustic wave filter assembly including a first surface acoustic wave filter coupled to a common node and a second surface acoustic wave filter coupled to the common node, where at least one of the first and second surface acoustic wave filters includes a surface acoustic wave filter according to any one aspect of this disclosure.

The surface acoustic wave filter assembly can further include a third surface acoustic wave filter coupled to the common node and a fourth surface acoustic wave filter coupled to the common node.

Another aspect of this disclosure is a wireless communication device including an antenna, and a multiplexer coupled to the antenna, where the multiplexer includes a plurality of surface acoustic wave filters coupled to a common node and arranged to filter a radio frequency signal, where at least one of the plurality of surface acoustic wave filters includes a surface acoustic wave filter according to any one aspect of this disclosure.

In one aspect, a surface acoustic wave filter is disclosed. The surface acoustic wave filter can include a substrate having a first side and a second side opposite the first side, a first surface acoustic wave filter structure over the first side of the substrate, and a second surface acoustic wave filter structure over the second side of the substrate. The first surface acoustic wave filter structure includes a first piezoelectric layer, a plurality of first surface acoustic wave resonators formed with the first piezoelectric layer, and a first wiring layer connecting the plurality of first surface acoustic wave resonators to each other. The first surface acoustic wave filter structure includes a first radio frequency filter belonging to a first frequency band. The second surface acoustic wave filter structure includes a second piezoelectric layer, a plurality of second surface acoustic wave resonators formed with the second piezoelectric layer, and a second wiring layer connecting the plurality of second surface acoustic wave resonators to each other. The second surface acoustic wave filter structure includes a second radio frequency filter belonging to a second frequency band different from the first frequency band. The surface acoustic wave filter can include a plurality of through electrodes extending at least partially through the substrate, the first piezoelectric layer, and the second piezoelectric layer.

In one embodiment, the first radio frequency filter includes a circuit including the first surface acoustic wave resonators and the first wiring layer on the top surface of the first piezoelectric layer, and the second radio frequency filter includes a circuit including the second surface acoustic wave resonators and the second wiring layer on the bottom surface of the second piezoelectric layer.

In one embodiment, the surface acoustic wave filter further includes a first dielectric layer between the first piezoelectric layer and the substrate, and a second dielectric layer between the second piezoelectric layer and the substrate.

In one embodiment, the surface acoustic wave filter further includes a first cavity roof forming a first cavity and a second cavity roof forming a second cavity. The first surface acoustic wave resonators and the first wiring layer can be disposed in the first cavity. The second surface acoustic wave resonators and the second wiring layer can be disposed in the second cavity. The surface acoustic wave filter can further include a first cavity frame supporting the first cavity roof, and a second cavity frame supporting the second cavity roof. The surface acoustic wave filter can further include a third wiring layer formed on the second cavity roof connecting at least some of the plurality of through electrodes to each other, a resin layer formed over the third wiring layer, and a packaging terminal formed on a bottom surface of the resin layer. The third wiring layer can further include a seed layer between the second piezoelectric layer and the second cavity roof. The packaging terminal can be connected to the third wiring layer via a column electrode extending in a thickness direction of the resin layer. The surface acoustic wave filter can further include a solder ball formed on an end face of the packaging terminal.

In one embodiment, at least some of the plurality of through electrodes are formed as a unit of through electrodes adjacently disposed together.

In one embodiment, the plurality of through electrodes include a through electrode connected to the first wiring layer and/or the second wiring layer.

In one embodiment, the plurality of through electrodes include a through electrode electrically isolated from the first wiring layer. The through electrode can be electrically isolated from the second wiring layer.

In one embodiment, a first through electrode and a second through electrode of the plurality of through electrodes are configured to connect to the first radio frequency filter. When the first through electrode is disconnected from the first radio frequency filter, the second through electrode can be connected to the first radio frequency filter to function as a redundancy connection.

In one embodiment, at least one of the first radio frequency filter and the second radio frequency filter includes a ladder filter having a passband in a radio frequency band, the ladder filter being formed by the plurality of first or second surface acoustic wave resonators connected to each other in a ladder configuration.

In one aspect, a packaged filter chip is disclosed. The packaged filter chip can include a first surface acoustic wave filter belonging to a first frequency band, a second surface acoustic wave filter belonging to a second frequency band different from the first frequency band, a substrate disposed between the first and second surface acoustic wave filters, and a plurality of through electrodes extending between the first and second surface acoustic wave filters through the substrate. The plurality of through electrodes including a first set of through electrodes that are electrically connected to the first surface acoustic wave filter and a second set of through electrodes that are electrically isolated from the first surface acoustic wave filter.

In one embodiment, the packaged filter chip further includes a terminal electrically connected to the first surface acoustic wave filter at least partially through the first set of through electrodes, the terminal configured to connect to an external system or a carrier. The second set of through electrodes can be electrically isolated from the terminal.

In one embodiment, the first surface acoustic wave filter includes a first piezoelectric layer, a plurality of first surface acoustic wave resonators, and a first wiring layer connecting the plurality of first surface acoustic wave resonators to each other, and the second surface acoustic wave filter includes a second piezoelectric layer, a plurality of second surface acoustic wave resonators, and a second wiring layer connecting the plurality of second surface acoustic wave resonators to each other, a thickness of the second piezoelectric layer being different from a thickness of the first piezoelectric layer. The plurality of first surface acoustic wave resonators and a first wiring layer can be disposed in a first cavity defined at least in part by a portion of the first piezoelectric layer, a first cavity frame, and a first roof.

In one aspect, a method of manufacturing a packaged surface acoustic wave filter chip is disclosed. The method can include providing a structure having first interdigital transducer electrodes formed with a first piezoelectric layer, second interdigital transducer electrodes formed with a second piezoelectric layer, and a substrate between the first and second piezoelectric layers, and forming a plurality of through electrodes extending at least partially through a thickness of the structure such that a first set of through electrodes of the plurality of through electrodes are electrically connected to the first interdigital transducer electrodes and a second set of through electrodes of the plurality of through electrodes are electrically isolated from the first interdigital transducer electrodes.

In one embodiment, the method further includes providing a first cavity frame over the first piezoelectric layer, the first cavity frame laterally surrounding the first interdigital transducer electrodes. The method can further include providing a first roof over the first cavity frame to define a first cavity between the first piezoelectric layer and the first roof. The method can further include providing a second cavity frame over the second piezoelectric layer, the second cavity frame laterally surrounding the second interdigital transducer electrodes; and providing a second roof over the second cavity frame to define a second cavity between the first piezoelectric layer and the second roof. The method can further include providing an encapsulation layer over the second roof. The method can further include forming a conductive via at least partially through the encapsulation layer. The method can further include forming a terminal over the conductive via, the terminal electrically connected to the first interdigital transducer electrode at least partially through the first set of through electrodes and the conductive via.

In one embodiment, a thickness of the first piezoelectric layer is different from a thickness of the second piezoelectric layer.

In one embodiment, the first interdigital transducer electrodes define a first surface acoustic wave filter belongs to a first frequency band and the second interdigital transducer electrodes define a second surface acoustic wave filter belongs to a second frequency band.

The present disclosure relates to U.S. patent application Ser. No. 18/061,963, titled "MULTI-BAND SURFACE ACOUSTIC WAVE FILTERS," filed on even date herewith, the entire disclosure of which are hereby incorporated by reference herein

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
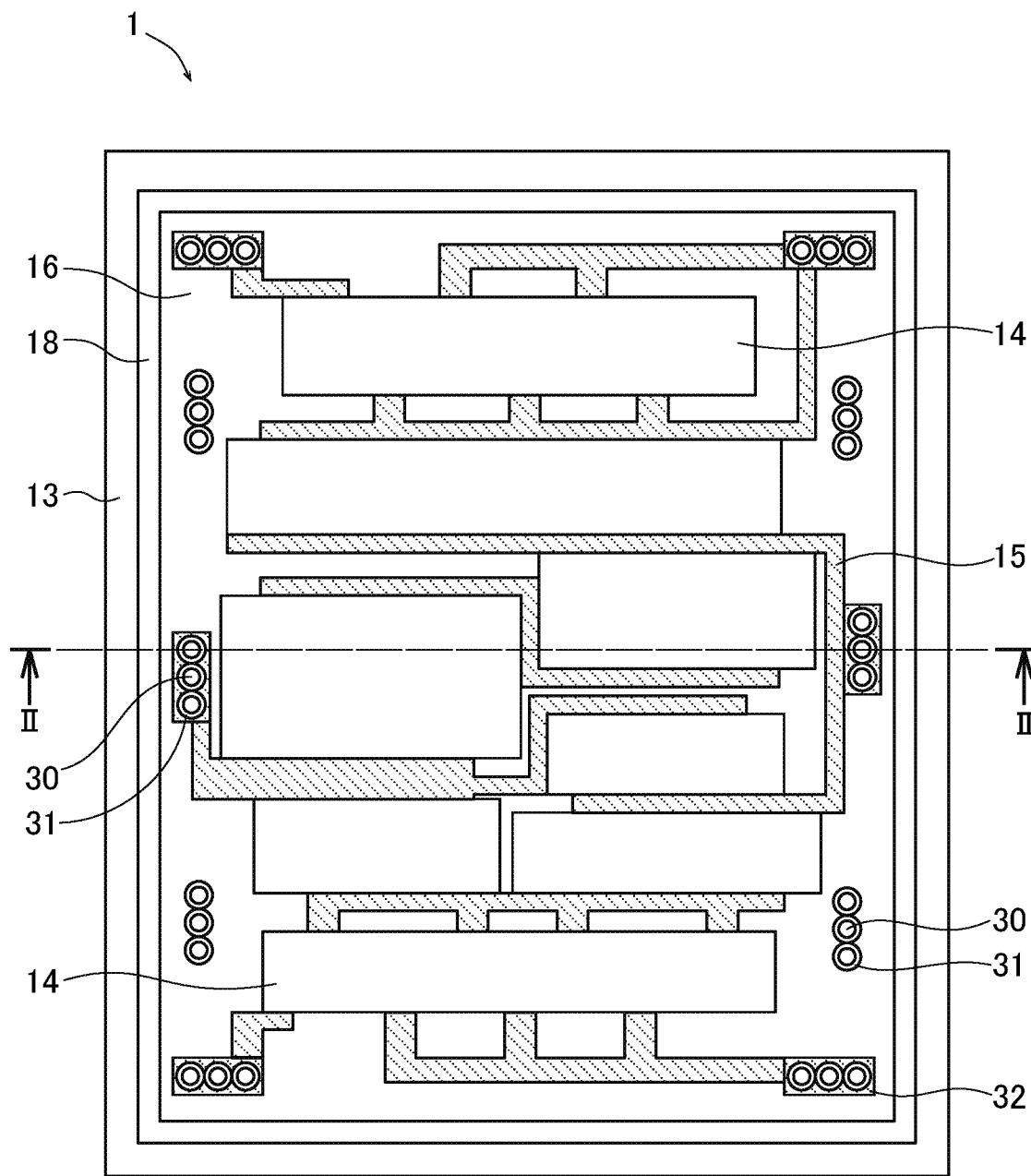
FIG. 1 is a schematic top plan view of a surface acoustic wave filter according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

There is a demand for miniaturization of communication devices and communication devices for multiple frequency bands. There is a demand for a miniaturized chip size and a common package for a plurality of frequency band chips also in a high frequency filter. An example of a common package can be a package in which two chips of different sizes are stacked and mounted. There is also a package that includes device wafers of different frequency bands that are bonded together. However, in the former case, since different chip sizes are used, there can be a limitation to the chip size miniaturization. In the latter case, the product yield may be lower than the product yield of individual device wafers because the device wafers are bonded together.

Various embodiments disclosed herein relate to commonly-packaged multi-band filters. In a surface acoustic wave (SAW) filter according to an embodiment, a plurality of SAW resonators are formed on a piezoelectric layer deposited each of front and back main surfaces of a single chip substrate and can thereby configure at least one radio frequency filter formed on each of the front and back sides of the substrate to filter different frequency band signals between the front and back sides. According to the SAW filter of the embodiment, radio frequency filters that cover two frequency bands are realized by a single chip package and thus the number of parts used in a wireless communication device such as a mobile phone can be reduced and the device can be downsized.

Figure 2:
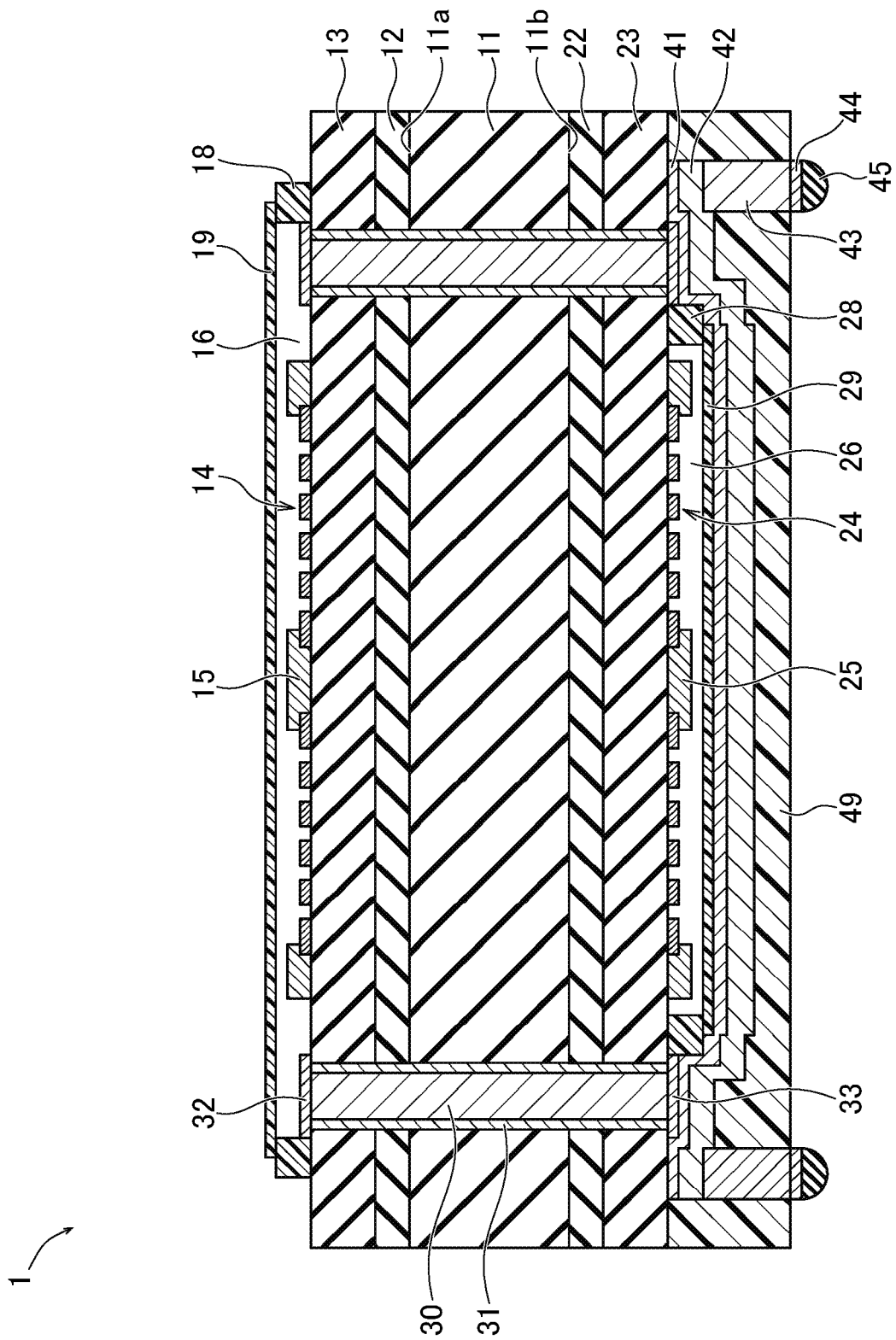
FIG. 2 is a schematic cross-sectional side view of the surface acoustic wave filter of FIG. 1.

FIG. 1 is a plan view of a SAW filter 1 according to an embodiment. FIG. 1 is omits a first cavity roof 19 (see FIG. 2) covering a portion of a top surface of a first piezoelectric layer 13 to show internal components. FIG. 2 is a cross-sectional view of the SAW filter 1. In particular, FIG. 2 shows a cross-sectional view taken along line II-II shown in the plan view of FIG. 1.

With reference to the cross-sectional view of FIG. 2, the SAW filter 1 includes a substrate 11 having a certain thickness. In some embodiments, the thickness of the substrate 11 can be selected bases at least in part on a desired thickness of the SAW filter 1. The substrate 11 includes a first side (e.g., a first main surface 11a) and a second side (e.g., a second main surface 11b) opposite to each other. A first dielectric layer 12 can be formed on the first main surface 11a and a second dielectric layer 22 can be formed on the second main surface 11b. A first piezoelectric layer 13 can be formed on a top surface of the first dielectric layer 12 and a second piezoelectric layer 23 can be formed on a bottom surface of the second dielectric layer 22. It should be appreciated that the first piezoelectric layer 13 can be provided directly on the first main surface 11a with no first dielectric layer 12 interposed therebetween, and that the second piezoelectric layer 23 can be provided directly on the second main surface 11b with no second dielectric layer 12 interposed therebetween.

Although the substrate 11 is assumed to be formed of silicon material according to this embodiment, in some other embodiments, the substrate 11 can be formed of any other suitable high impedance material such as aluminum nitride, silicon nitride, magnesium oxide spinel, magnesium oxide crystal, or sapphire. The first dielectric layer 12 and the second dielectric layer 22 can be formed of material such as silicon dioxide ($SiO_2$) or silicon nitride (SiN). The first dielectric layer 12 and the second dielectric layer 22 can be formed by depositing dielectric material on the first main surface 11a and the second main surface 11b, and can also be formed by allowing the silicon material to be oxidized or nitrided on the first main surface 11a and the second main surface 11b of the substrate 11.

Although the first piezoelectric layer 13 and the second piezoelectric layer 23 are assumed to be formed of lithium tantalate (LiTaO$_3$ also referred to as LT), these layers can be formed of any other suitable piezoelectric material such as lithium niobate (LiNbO$_3$ also referred to as LN) in some other embodiments. The first piezoelectric layer 13 and the second piezoelectric layer 23 may have a thickness ranging from, for example, 2λ, to 5λ, or 2λ, to 4λ, where λ is a wavelength of a surface acoustic wave propagating the respective piezoelectric layers. The first piezoelectric layer 13 and the second piezoelectric layer 23 may have different thicknesses from each other. The first dielectric layer 12 and the second dielectric layer 22 may be bonded to the first piezoelectric layer 13 and the second piezoelectric layer 23, respectively, by a suitable process such as an anode bonding process.

The substrate 11 has an acoustic impedance higher than those of the first piezoelectric layer 13 and the second piezoelectric layer 23. Thus, surface acoustic waves excited in the first piezoelectric layer 13 and the second piezoelectric layer 23 can be reflected by the first main surface 11a and the second main surface 11b of the substrate 11, respectively. As a result, the excitation energy of the surface acoustic waves can be confined in the first piezoelectric layer 13 and the first dielectric layer 12 on the first main surface 11a side and confined in the second piezoelectric layer 23 and the dielectric layer 22 on the second main surface 11b side.

Further, the first dielectric layer 12 and the second dielectric layer 22 may each have a negative temperature coefficient of frequency. In such a case, the positive temperature coefficient of frequency of the first piezoelectric layer 13 and the second piezoelectric layer 23 deposited on the first dielectric layer 12 and the second dielectric layer 22, respectively, can be cancelled such that the variation in frequency characteristics of the SAW filter 1 caused by a temperature change can be reduced.

With reference to the plan view of FIG. 1 and the cross-sectional view of FIG. 2, the SAW filter 1 can include a plurality of interdigital transducer (IDT) electrodes 14 and a first wiring layer 15 formed on the top surface of the first piezoelectric layer 13 with a substantially rectangular shape. The plurality of first IDT electrodes 14 include bus bars (not shown) extending in a propagating direction of a surface acoustic wave and opposing each other, and electrode fingers alternately extending from the bus bars in a direction generally perpendicular to the propagating direction to allow the surface acoustic wave to be excited. Each of the plurality of first IDT electrodes 14 can form a SAW resonator. In addition to the plurality of first IDT electrodes 14, a reflection electrode can be formed on either side or reflection electrodes can be formed on both sides in the propagation direction of the surface acoustic wave from the first IDT electrodes 14. The first wiring layer 15 extends between the plurality of first IDT electrodes 14 to electrically connect at least two of more of the first IDT electrodes 14 to each other. Each of the plurality of first IDT electrodes 14 and the first wiring layer 15 may be formed of any suitable metal material such as copper or aluminum. In some embodiments, the plurality of first IDT electrodes 14 and the first wiring layer 15 can include the aluminum (Al), molybdenum (Mo), tungsten (W), platinum (Pt), copper (Cu) or an alloy, such as AlMgCu, AlCu, etc.

The SAW filter 1 can include a plurality of through electrodes 30, such as through vias filled with or covered by a conductive material. The plurality of through electrodes 30 can be formed to extend through the first piezoelectric layer 13, the first dielectric layer 12, the substrate 11, the second dielectric layer 22, and the second piezoelectric layer 23, and terminate and form a first end face on the top surface of the first piezoelectric layer 13. Each of the plurality of through electrodes 30 can be formed in, for example, a columnar shape having a certain diameter and extending in a thickness direction of the substrate 11. The lateral surface of the through electrode 30 can be surrounded by a barrier layer 31 for blocking a diffusion of the metal forming the through electrode 30. The plurality of through electrodes 30 may be formed of metal such as copper. The barrier layer 31 may be formed of alloy containing cobalt, boron, tungsten, and the like.

As shown in FIG. 1, in some embodiments, the plurality of through electrodes 30 can be formed as a single unit of three through electrodes 30 adjacently arranged in line on the top surface of the first piezoelectric layer 13. In some other embodiments, more or less than three through electrodes 30 can define one unit. In some embodiments, the plurality of through electrodes 30 of the single unit can be used for different purposes. On the through electrodes 30 arranged in one unit, a first terminal pad 32 can be formed to cover the first end face of a through electrode 30. The first terminal pad 32 can be connected to the first wiring layer 15. The first terminal pad 32 may be formed of metal such as copper or aluminum. On the through electrodes 30 arranged in another unit, the first terminal pad 32 may not formed and the first end face may be exposed or accessible on the top surface of the first piezoelectric layer 13 to electrically isolate the other unit of the through electrodes 30 from the first wiring layer 15 and the first IDT electrode 14. It should be appreciated that another number and another arrangement of through electrodes 30 can be formed as a unit and the through electrodes 30 can be formed separately.

As shown in FIG. 1, a first cavity frame 18 can be formed on the top surface of the first piezoelectric layer 13 to at least partially surround (e.g., completely surround) the plurality of first IDT electrodes 14, the first wiring layer 15, and the plurality of through electrodes 30 along a substantially rectangular shaped periphery. As shown in FIG. 2, the first cavity frame 18 has certain height and width and supports a first cavity roof 19 at a height to form a first cavity 16 over the plurality of first IDT electrodes 14, the first wiring layer 15, and the plurality of through electrodes 30. The first cavity frame 18 and the first cavity roof 19 can be formed of polyimide-based resin or epoxy-based resin, for example, and can be bonded to each other by an adhesive. The height of the first cavity frame 18 can be sufficiently tall to accommodate the plurality of first IDT electrodes 14 and the first wiring layer 15 in the first cavity 16. For example, the height of the first cavity frame 18 can be taller than the tallest one of the plurality of first IDT electrodes 14 and the first wiring layer 15, and less than twice the height of the tallest one of the plurality of first IDT electrodes 14 and the first wiring layer 15.

Figure 3:
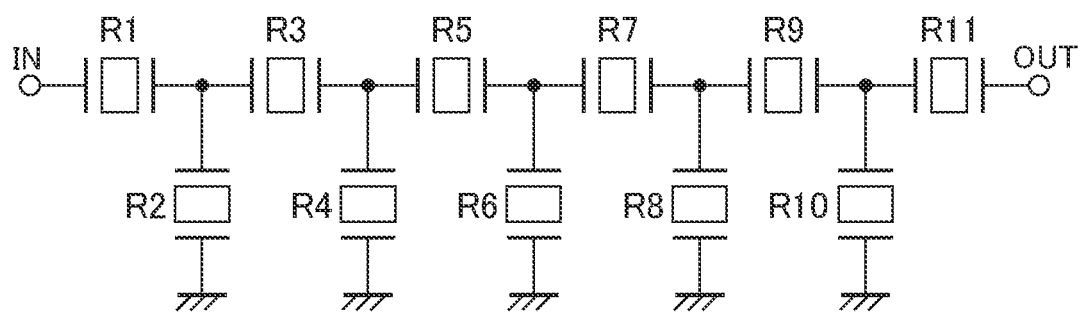
FIG. 3 is a schematic diagram of a radio frequency filter that includes a surface acoustic wave filter according to an embodiment.

FIG. 3 is a circuit diagram showing an example of a first radio frequency filter including the plurality of first IDT electrodes 14, the first wiring layer 15, and the like formed on the top surface of the first piezoelectric layer 13 of FIGS. 1 and 2. On the top surface of the first piezoelectric layer 13, the first wiring layer 15 electrically can connect a plurality of SAW resonators, each of which can be formed by each of the plurality of first IDT electrodes 14, to configure the first radio frequency filter. The first piezoelectric layer 13 can be formed to have a suitable thickness depending at least in part on a band of the first radio frequency filter. Although a single first radio frequency filter can be formed by the plurality of first IDT electrodes 14, the first wiring layer 15, and the like, two or more first radio frequency filters can also be formed.

An example of the first radio frequency filter shown in FIG. 3 is a ladder filter including a plurality of SAW resonators R1, R2, R3, R4, R5, R6, R7, R8, R9, R10 and R11 disposed along a series arm between an input port IN and an output port OUT. SAW resonators R1, R3, R5, R7, R9 and R11 are configured as series-arm resonators and can be connected in series between the input port IN and the output port OUT. SAW resonators R2, R4, R6, R8 and R10 are configured as parallel-arm resonators and can be connected in parallel between the series-arm resonators R1, R3, R5, R7, R9 and R11 and a ground. The parallel-arm resonators R2, R4, R6, R8 and R10 may be referred to as shunt resonators. In some embodiments, respective series-arm resonators R1, R3, R5, R7, R9 and R11 may have the same resonant frequency. In some embodiments, the plurality of shunt resonators R2, R4, R6, R8 and R10 may have resonant frequencies below those of series-arm resonators R1, R3, R5, R7, R9 and R11, respectively. At least one of the plurality of shunt resonators R2, R4, R6, R8 and R10 may have a first resonant frequency different from a resonant frequency of one of the other shunt resonator(s). At least one of the plurality of shunt resonators R2, R4, R6, R8 and R10 may have a second resonant frequency different from the first resonant frequency and different from a resonant frequency of one of the other shunt resonator(s).

Returning to FIG. 2, a plurality of second IDT electrodes 24 and a second wiring layer 25 can be formed on a bottom surface of the second piezoelectric layer 23 having a substantially rectangular shape in the plan view similar to the top surface of the first piezoelectric layer 13. The plurality of second IDT electrodes 24 include bus bars (not shown) extending in a propagating direction of a surface acoustic wave and opposing each other and electrode fingers alternately extending from the bus bars in a direction generally perpendicular to the propagating direction to allow the surface acoustic wave to be excited. Each of the plurality of second IDT electrodes 24 can form a SAW resonator. In addition to the plurality of second IDT electrodes 24, a reflection electrode can be formed on either side or reflection electrodes can be formed on both sides in the propagation direction of the surface acoustic wave from the second IDT electrodes 24. The second wiring layer 25 extends between at least two of more of the plurality of second IDT electrodes 24 to electrically connect the second IDT electrodes 24 to each other. Each of the plurality of second IDT electrodes 24 and the second wiring layer 25 may be formed of any suitable metal material such as copper or aluminum. In some embodiments, plurality of first IDT electrodes 14 and the first wiring layer 15 can include the aluminum (Al), molybdenum (Mo), tungsten (W), platinum (Pt), copper (Cu) or an alloy, such as AlMgCu, AlCu, etc.

Each of the plurality of through electrodes 30 can terminate and form a second end face on the bottom surface of the second piezoelectric layer 23. The plurality of through electrodes 30 can be formed as a single unit of three through electrodes 30 adjacently arranged in line also on the bottom surface of the second piezoelectric layer 23. On the through electrodes 30 arranged in one unit, a second terminal pad 33 can be formed to cover the second end faces of the through electrodes 30. A portion of the second terminal pad 33 can be electrically connected to the second wiring layer 25 and another portion can be electrically connected to a third wiring layer 42 through a third seed layer 41 as discussed below. The second terminal pad 33 may be formed of metal such as copper or aluminum. On the through electrodes 30 arranged in another unit, the second terminal pad 33 may not be formed and the second end face may be exposed or accessible on the bottom surface of the second piezoelectric layer 23 to electrically isolate the other unit of the through electrodes 30 from the second wiring layer 25 and the second IDT electrode 24.

Similar to the first piezoelectric layer 13 shown in FIG. 1, a second cavity frame 28 can be formed on the bottom surface of the second piezoelectric layer 23 to at least partially surround (e.g., completely surround) the plurality of second IDT electrodes 24, and the second wiring layer 25 along a substantially rectangular shaped periphery. In some embodiments, some of the plurality of through electrodes 30 may be disposed laterally within the second cavity frame 28. As shown in FIG. 2, the second cavity frame 28 has certain height and width, and supports a second cavity roof 29 at a height to form a second cavity 26 over the plurality of second IDT electrodes 24, the second wiring layer 25, and some of the plurality of through electrodes 30. The second cavity frame 28 and the second cavity roof 29 can be formed of polyimide-based photosensitive resin or epoxy-based photosensitive resin, for example, and can be bonded to each other by adhesive. The height of the second cavity frame 28 can be sufficiently tall to accommodate the plurality of second IDT electrodes 24 and the second wiring layer 25 in the second cavity 26. For example, the height of the second cavity frame 28 can be taller than the tallest one of the plurality of second IDT electrodes 24 and the second wiring layer 25, and less than twice the height of the tallest one of the plurality of second IDT electrodes 24 and the second wiring layer 25.

The third seed layer 41 and the third wiring layer 42 can be formed on the bottom surface of the second piezoelectric layer 23 and the bottom surface of the second cavity roof 29. First and second seed layers will be discussed in the section of manufacturing method of a SAW filter below. In some embodiments, the third seed layer 41 may be formed of alloy containing titanium and copper, for example, and the third wiring layer 42 may be formed of copper, for example. The third wiring layer 42 can be deposited on the third seed layer 41 by plating and can be connected to the second terminal pad 33 through the third seed layer 41. The third wiring layer 42 can be electrically connected to a column electrode 43 as discussed below.

On the bottom surface of the second piezoelectric layer 23, an encapsulating resin layer 49 having a thickness sufficient to at least partially cover (e.g., completely cover) the bottom surface of the second cavity roof 29 and the third wiring layer 42 can be formed. The encapsulating resin layer 49 may be formed of polyimide-based resin or epoxy-based resin, for example. A column electrode 43 can be formed at a certain location on the third seed layer 41 and/or the third wiring layer 42 deposited on the bottom surface of the second piezoelectric layer 23. The column electrode 43 has a certain diameter and extends from the bottom surface of the third wiring layer 42 in the thickness direction of the encapsulating resin layer 49. The column electrode 43 can extend through the encapsulating resin layer 49 and has an end face exposed or accessible on the bottom surface of the encapsulating resin layer 49. The location where the column electrode 43 is formed on the third wiring layer 42 may be adjacent to the second terminal pad 33 formed on the second end face of a through electrode 30.

A packaging terminal 44 can be formed at an end face of the column electrode 43 exposed or accessible on the bottom surface of the encapsulating resin layer 49. The packaging terminal 44 can be electrically connected to one or more of the plurality of first IDT electrodes 14 at least partially through the through electrode 30. The packaging terminal 44 may be formed of metal such as copper, for example. A solder ball 45 can be formed on the bottom surface of the packaging terminal 44. The SAW filter 1 can be electrically connected to a larger system or a substrate (e.g., printed circuit board (PCB)) through the packaging terminal 44 and the solder ball 45.

A second radio frequency filter can include a plurality of second IDT electrodes 24, the second wiring layer 25, and the like formed on the bottom surface of the second piezoelectric layer 23. On the bottom surface of the second piezoelectric layer 23, the second wiring layer 25 can connect a plurality of SAW resonators, each of which can be formed by each of the plurality of second IDT electrodes 24, to configure the second radio frequency filter. The second piezoelectric layer 23 can be formed to have a suitable thickness depending at least in part on a band of the second radio frequency filter. The second piezoelectric layer 23 can be formed to have a thickness different from the thickness of the first piezoelectric layer 13 such that the first radio frequency filter using the first piezoelectric layer 13 and the second radio frequency filter using the second piezoelectric layer 23 can filter different frequency band signals. In some embodiments, the first piezoelectric layer 13 can be thicker than the second piezoelectric layer 23. In some other embodiments, the first piezoelectric layer 13 can be thinner than the second piezoelectric layer 23. A difference between the thicknesses of the first and second piezoelectric layers 13, 23 can be, for example, 0.01$\lambda$ to 5$\lambda$, or 0.1$\lambda$ to 2$\lambda$, where $\lambda$ is a wavelength of a surface acoustic wave propagating the respective piezoelectric layers. The second radio frequency filter can be configured as a ladder filter shown in FIG. 3. Although a single second radio frequency filter can be formed by the plurality of second IDT electrodes 24, the second wiring layer 25, and the like, two or more second radio frequency filters can also be formed.

In some embodiments, at least one first radio frequency filter configured by a plurality of SAW resonators formed on the first piezoelectric layer 13 deposited on the first main surface 11a of the front side of a single chip substrate 11 and at least one second radio frequency filter configured by a plurality of SAW resonators formed on the second main surface 11b of the back side of the single chip substrate 11 can belong to different frequency bands. According to some embodiments, two radio frequency filters that cover two respective frequency bands are realized by a single chip package and thus the number of parts used in a wireless communication device such as a mobile phone can be reduced and in turn the device can be downsized.

In the SAW filter 1 of the illustrated embodiment, high impedance silicon is used for the substrate 11. Accordingly, the excitation energy of surface acoustic waves can be confined within the first piezoelectric layer 13 and the first dielectric layer 12, and within the second piezoelectric layer 23 and the second dielectric layer 22, respectively. Thus, the surface acoustic waves can be prevented or mitigated from leaking into the high impedance substrate 11 such that relatively high quality factor can be obtained.

In some embodiments, the plurality of through electrodes 30 can be formed to extend at least partially through (e.g., completely through) the first piezoelectric layer 13, the first dielectric layer 12, the substrate 11, the second dielectric layer 22, and the second piezoelectric layer 23 and also formed as a single unit of three electrodes 30 adjacently arranged in line appearing on the top surface of the first piezoelectric layer 13 and the bottom surface of the second piezoelectric layer 23. The through electrodes 30 arranged in one unit can be connected to the first wiring layer 15 through the first terminal pad 32 at one end and connected to the second wiring layer 25 through the second terminal pad 33 at the other end.

In some embodiments, a circuit configured by the plurality of first IDT electrodes 14, the first wiring layer 15, and the like formed on the top surface of the first piezoelectric layer 13 can be connected to a circuit configured by the plurality of second IDT electrodes 24, the second wiring layer 25, and the like formed on the bottom surface of the second piezoelectric layer 23 at least partially through the through electrode 30 with a relatively low impedance to reduce parasitic capacitance. Thus, a radio frequency filter configured by such circuits may have improved attenuation characteristics. The three through electrodes 30 adjacently arranged are formed as a single unit. Accordingly, even if a separate through electrode 30 is disconnected, the unit through electrodes 30 can maintain the electrical connection as a whole. Thus, a risk of malfunction due to the through electrodes 30 being disconnected can be reduced to provide a reliable radio frequency filter. In some embodiments, one or more of the plurality of through electrodes 30 in a unit can function as one or more redundancy connections.

The through electrodes 30 arranged in another unit can include the first end face and the second end face exposed or accessible on the top surface of the first piezoelectric layer 13 and the bottom surface of the second piezoelectric layer 23, respectively, and separated and electrically isolated from the first wiring layer 15, the second wiring layer 25, and the like. Such through electrodes 30 extends through the substrate 11 to facilitate thermal conduction between the first piezoelectric layer 13 and dielectric layer 12 and the second piezoelectric layer 23 and dielectric layer 22. Heat dissipation caused by the through electrodes 30 may improve the thermal characteristics of the SAW filter. The exposed through electrodes 30 may be exposed to the first cavity 16 and/or the second cavity 26. In some embodiments, the exposed through electrodes 30 may be covered by another conductive material but may still be electrically isolated from the first wiring layer 15 and/or the second wiring layer 25. Therefore, the exposed through electrodes 30 may not be visibly exposed in the final structure of the SAW filter 1, but can be electrically exposed to the first cavity 16 and/or the second cavity 26 without electrically connected to the first wiring layer 15 and/or the second wiring layer 25.

Figure 4:
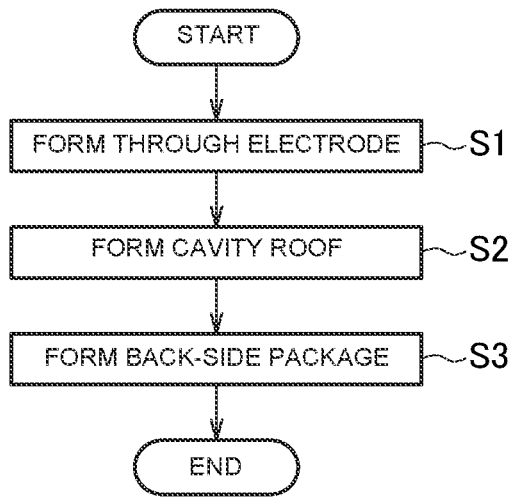
FIG. 4 is a flow diagram showing steps S1 to S3 of a method of manufacturing a surface acoustic wave filter according to an embodiment.
Figure 5A:
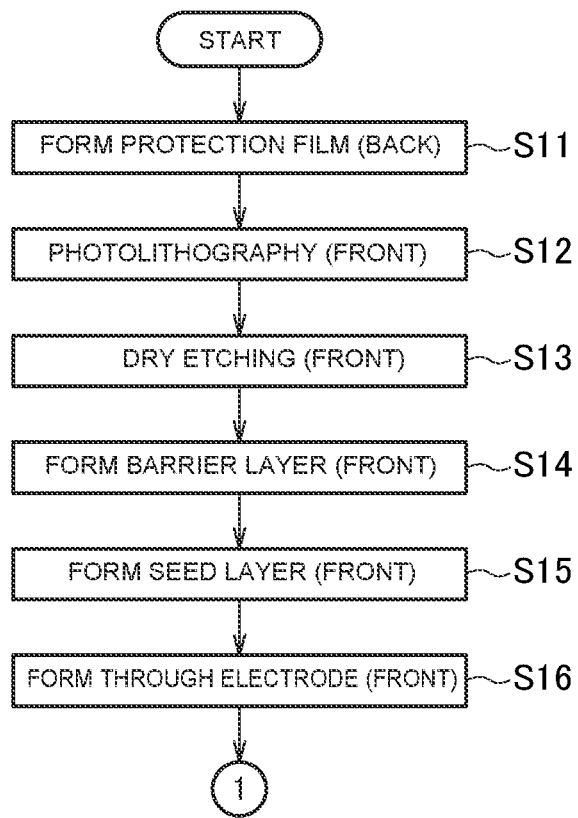
FIG. 5A is a flow diagram showing steps S11 to S16 included in step S1.
Figure 5B:
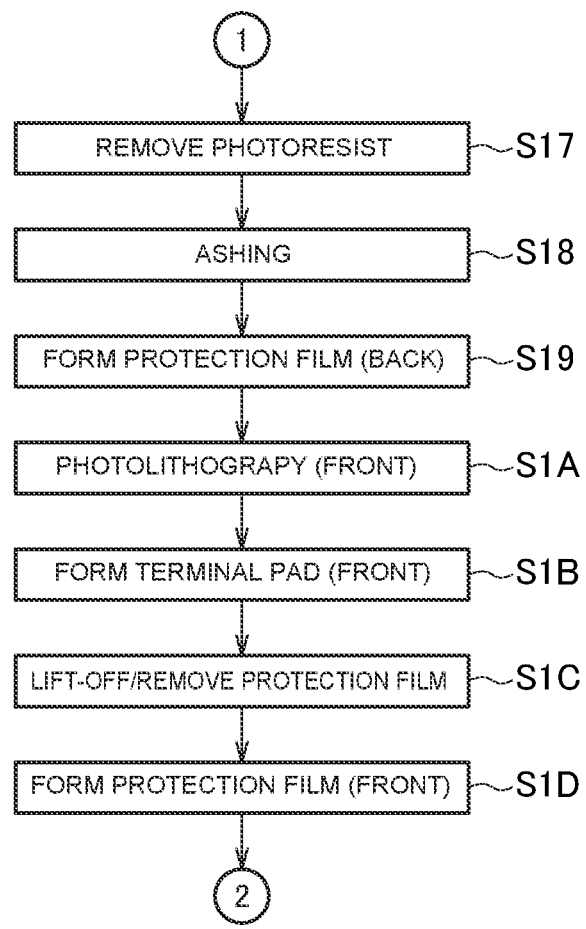
FIG. 5B is a flow diagram showing steps S17 to S1D included in step S1.
Figure 5C:
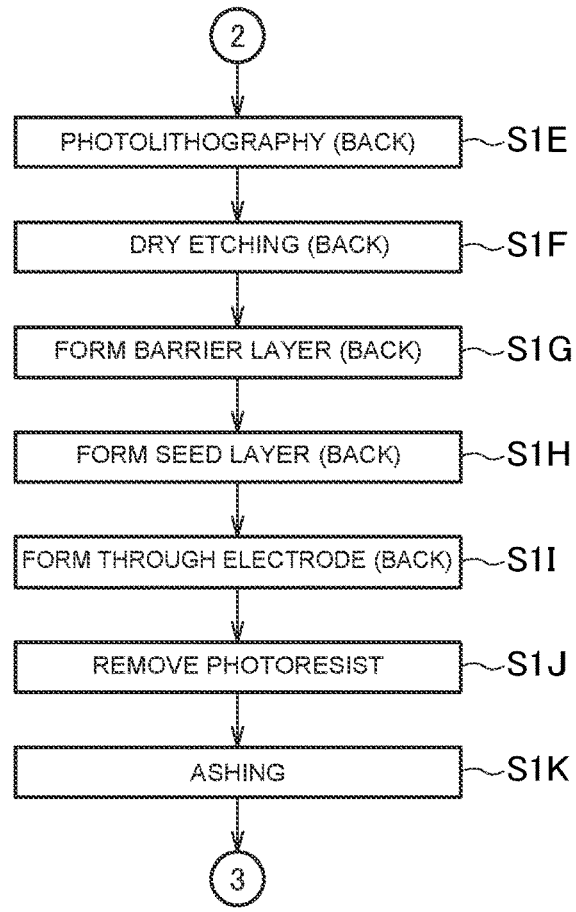
FIG. 5C is a flow diagram showing steps S1E to S1K included in step S1.
Figure 5D:
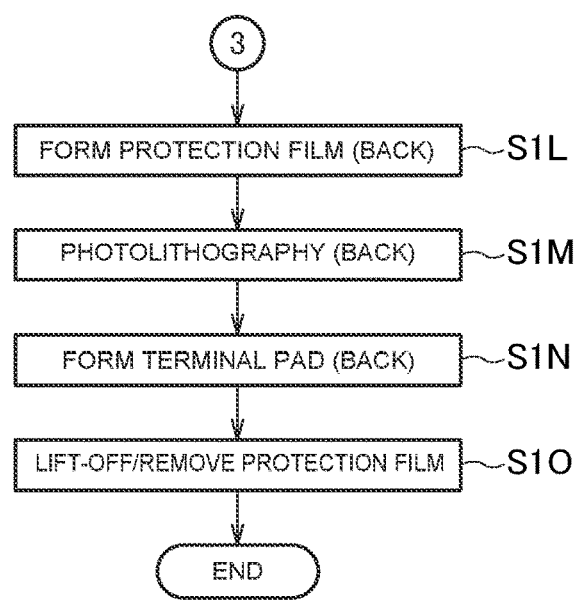
FIG. 5D is a flow diagram showing steps S1L to S1O included in step S1.
Figure 6A:
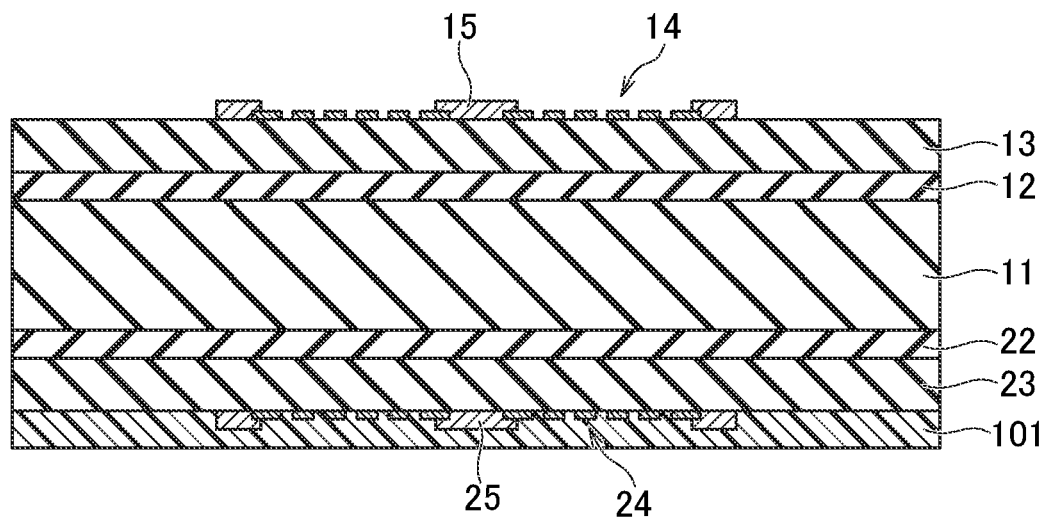
FIG. 6A is a cross-sectional view for describing step S11.

FIG. 4 is a flow diagram showing steps S1 to S3 of a method of manufacturing a SAW filter according to an embodiment. FIG. 5A is a flow diagram showing steps S11 to S16 included in step S1. FIG. 5B is a flow diagram showing steps S17 to S1D included in step S1. FIG. 5C is a flow diagram showing steps S1E to S1K included in step S1. FIG. 5D is a flow diagram showing steps S1L to S1O included in step S1. The SAW filter 1 discussed above with reference to FIGS. 1 to 3 can be manufactured according to the method of manufacturing the SAW filter that will be discussed below. The method of manufacturing the SAW filter in FIGS. 4 to 5D will be described referring to components of the SAW filter 1 disclosed herein. At step S1, a plurality of through electrodes 30 are formed through at least a portion of the SAW filter 1. Step S1 can include on or more of steps S11 to S16 of FIG. 5A, steps S17 to S1D of FIG. 5B, steps S1E to S1K of FIG. 5C, and steps S1L to S1O of FIG. 5D. FIGS. 6A to 6N are schematic cross-sectional side views showing structures of the steps of FIGS. 4 to 5D.

At step S11, an unfinished SAW filter chip, the cross-sectional view of which is shown in FIG. 6A, is fabricated. The cross-sectional view partially corresponds to the finished SAW filter 1 shown in FIG. 2. The cross-sectional views shown in FIG. 6A and subsequent figures illustrate the manufacturing processes performed step by step toward the finished SAW filter 1. Hereinafter, the unfinished SAW filter can be referred to as a workpiece for the purpose of convenience. Although FIG. 6A and subsequent figures show a chip workpiece corresponding to a single SAW filter, a plurality of workpieces on a wafer can be simultaneously fabricated and then separated into a plurality of chips.

In the workpiece shown in FIG. 6A, a first dielectric layer 12 and a first piezoelectric layer 13 can be provided (e.g., deposited) on a first main surface 11*a* of a substrate 11. A plurality of first IDT electrodes 14 and a first wiring layer 15 are formed on, at, or near a top surface of the first piezoelectric layer 13. A second dielectric layer 22 and a second piezoelectric layer 23 can be provided (e.g., deposited) on a second main surface 11*b* of the substrate 11. A plurality of second IDT electrodes 24 and a second wiring layer 25 are formed on, at, or near a bottom surface of the second piezoelectric layer 23.

Such a workpiece can be manufactured by the steps of: providing (e.g., depositing) the first dielectric layer 12 and the second dielectric layer 22 on the first main surface 11*a* and the second main surface 11*b*, respectively, of the substrate 11; providing (e.g., depositing) the first piezoelectric layer 13 and the second piezoelectric layer 23 on the top surface of the first dielectric layer 12 and the bottom surface of the second dielectric layer 22, respectively; and forming the plurality of first IDT electrode 14 and the first wiring layer 15 on, at, or near the top surface of the first piezoelectric layer 13 and forming the plurality of second IDT electrodes 24 and the second wiring layer 25 on, at, or near the bottom surface of the second piezoelectric layer 23. It should be appreciated that the step of depositing the first dielectric layer 12 and the second dielectric layer 22 on the first main surface 11*a* and the second main surface 11*b*, respectively, of the substrate 11 can be omitted and, in the subsequent step of depositing the first piezoelectric layer 13 and the second piezoelectric layer 23, the first piezoelectric layer 13 and the second piezoelectric layer 23 can be deposited directly on the first main surface 11*a* and the second main surface 11*b*, respectively.

At step S11, as shown in FIG. 6A, a first protection film 101 of photoresist can be formed to at least partially cover the plurality of second IDT electrodes 24 and the second wiring layer 25 on the bottom surface of the second piezoelectric layer 23 of the workpiece. In the flow diagrams, for sake of simplicity, the second main surface 11*b* side directionally corresponding to the bottom surface of the second piezoelectric layer 23 can be referred to as a back side with respect to the substrate 11, and the first main surface 11*a* side directionally corresponding to the top surface of the first piezoelectric layer 13 can be referred to as a front side opposing the back side.

Figure 6B:
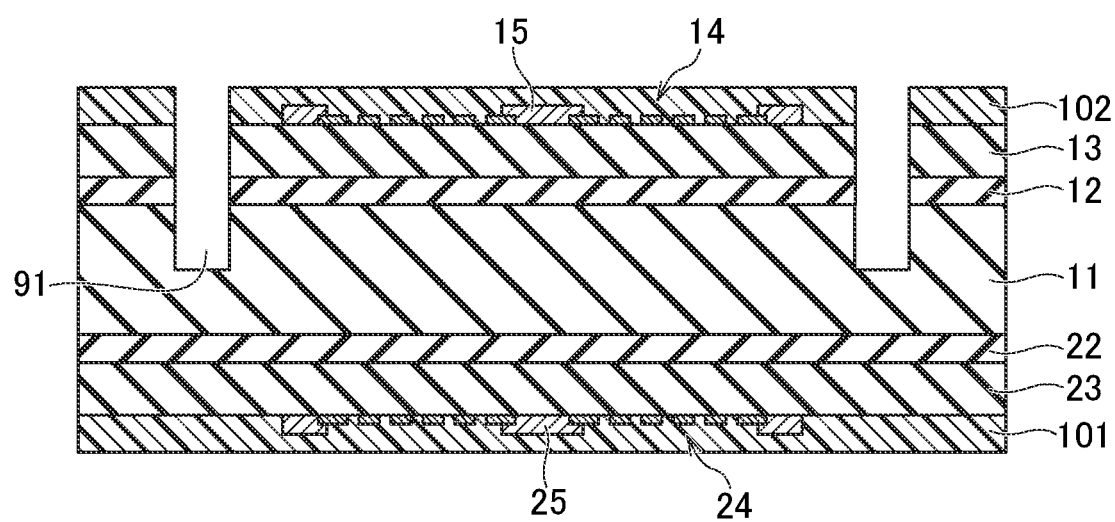
FIG. 6B is a cross-sectional view for describing steps S12 to 13.

At step S12, as shown in FIG. 6B, a second protection film 102 of photoresist can be formed to cover the plurality of first IDT electrodes 14 and the first wiring layer 15 on the top surface of the first piezoelectric layer 13 of the workpiece. The second protection film 102 can be patterned to expose an area corresponding to a first end face of a through electrode 30 and mask the remaining area using a photolithography process. The second protection film 102 can be patterned such that portions of the top surface of the first piezoelectric layer 13 that are free from the second protection film 102 are laterally offset from the first IDT electrodes 14 and the first wiring layer 15.

At step S13, the workpiece can be etched (e.g., dry etched). In the workpiece shown in FIG. 6B, a first recess 91 has been formed at an area corresponding to the first end face of a through electrode 30 exposed from the second protection film 102 by the etching process. The first recess 91 can extend through a thickness of the first piezoelectric layer 13, through a thickness of the first dielectric layer 12, and at least partially through the substrate 11. For example, the first recess 91 extends from the top surface of the first piezoelectric layer 13 in the thickness direction of the substrate 11 through the first piezoelectric layer 13 and the first dielectric layer 12 and then reaches a depth in the middle of the substrate 11. It would be understood that the bottom surface of the second piezoelectric layer 23 of the workpiece is covered with the first protection film 101 and thus is not affected by the dry etching process.

Figure 6C:
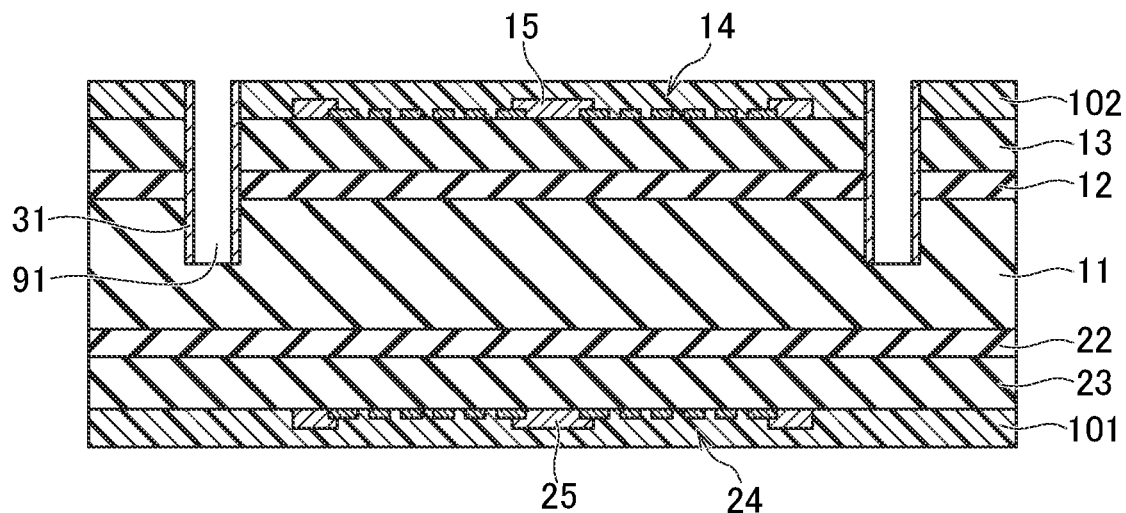
FIG. 6C is a cross-sectional view for describing step S14.

At step S14, a barrier layer 31 is formed on a laterally peripheral surface within the first recess 91 formed at step S13. By nature of the process of forming the barrier layer 31, a bottom surface of the first recess 91 and/or an upper surface of the second protection film 102 may be covered by the barrier layer 31. FIG. 6C shows the workpiece in which the barrier layer 31 is formed on the laterally peripheral surface within the first recess 91. The barrier layer 31 can be formed of alloy containing cobalt, boron, tungsten, and the like.

At step S15, a first seed layer (not shown) of metal such as copper can be formed in the first recess 91 covered with the barrier layer 31 at step S14. The first seed layer can be formed to at least partially (e.g., completely cover) the barrier layer 31 formed on the laterally peripheral surface of the first recess 91 and a bottom of the first recess 91.

Figure 6D:
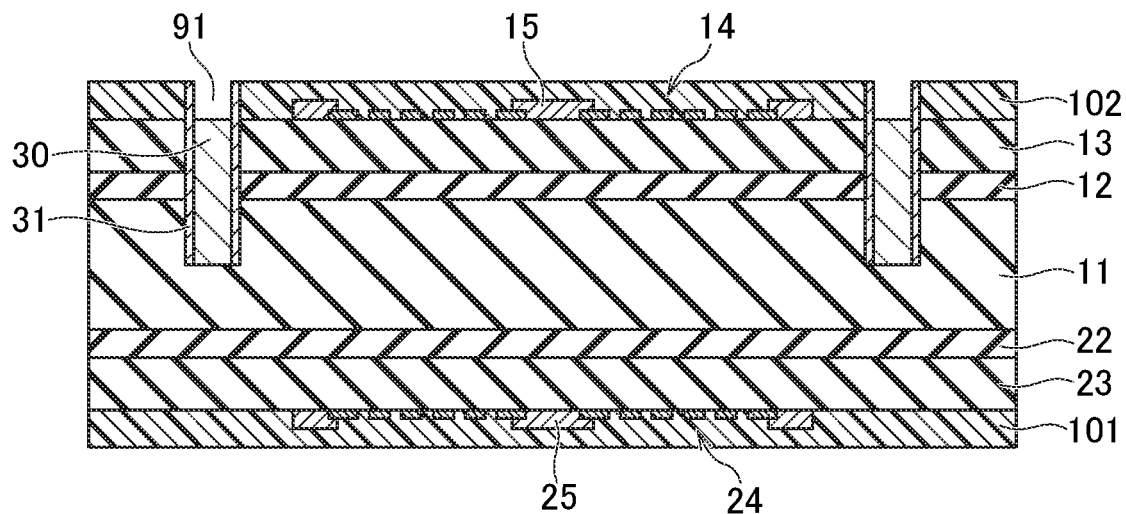
FIG. 6D is a cross-sectional view for describing steps S15 to S16.

At step S16, metal such as copper can be deposited on the first seed layer (not shown) formed by plating or the like on the barrier layer 31 that is deposited on the lateral inner surface of the first recess 91 and on the bottom of the first recess 91 at step S15. As shown in FIG. 6D, the first recess 91 is filled with the metal deposited by plating on the first seed layer in the workpiece from the bottom of the first recess 91 to the top surface of the first piezoelectric layer 13 along the barrier layer 31 covering the laterally peripheral surface of the first recess 91. The metal at least partially filling (e.g., completely filing) the first recess 91 forms a portion of a through electrode 30. In some embodiments, the metal can be conformally provided in the first recess 91 to define a conformal via as the through electrode 30. The barrier layer 31 can function as a diffusion barrier that prevents or mitigate the material of the through electrode 30 from diffusing into the substrate 11, the first dielectric layer 12, and/or the first piezoelectric layer 13.

At step S17, the photoresists of the first protection film 101 and the second protection film 102 can be removed from the workpiece including a portion of a through electrode 30 formed of the metal that has filled the first recess 91 at step S16. Thus, a suitable solution is used for peeling and removing the photoresists of the first protection film 101 and the second protection film 102.

Figure 6E:
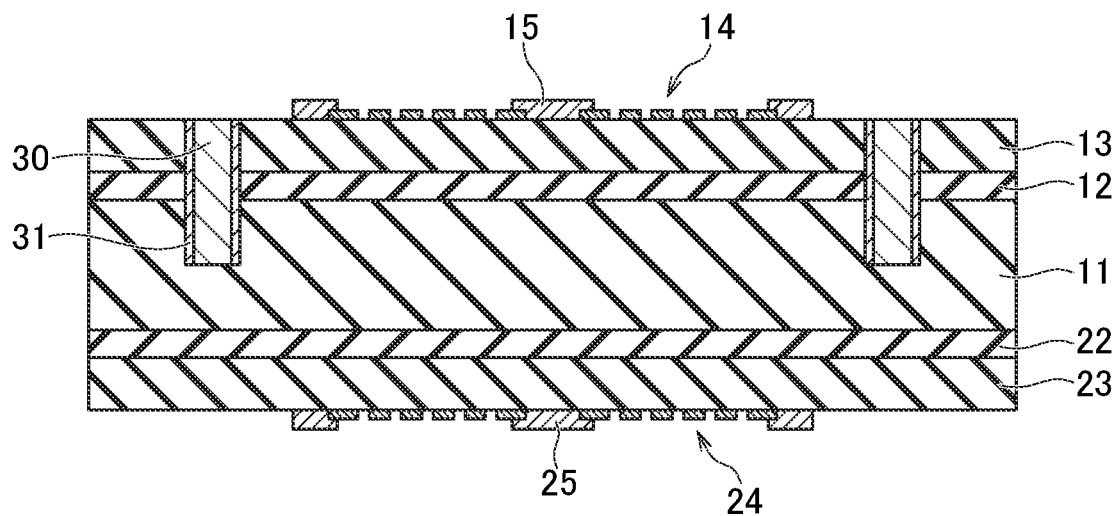
FIG. 6E is a cross-sectional view for describing steps S17 to S18.

At step S18, some of the photoresists of the first protection film 101 and the second protection film 102, which were not removed and remain in the workpiece regardless of peeling and removing the first protection film 101 and the second protection film 102 at step S17, are dissolved and removed by an ashing process. As shown in FIG. 6E, the first protection film 101 and the second protection film 102 are removed and the top surface of the first piezoelectric layer 13 and the bottom surface of the second piezoelectric layer 23 are exposed.

Figure 6F:
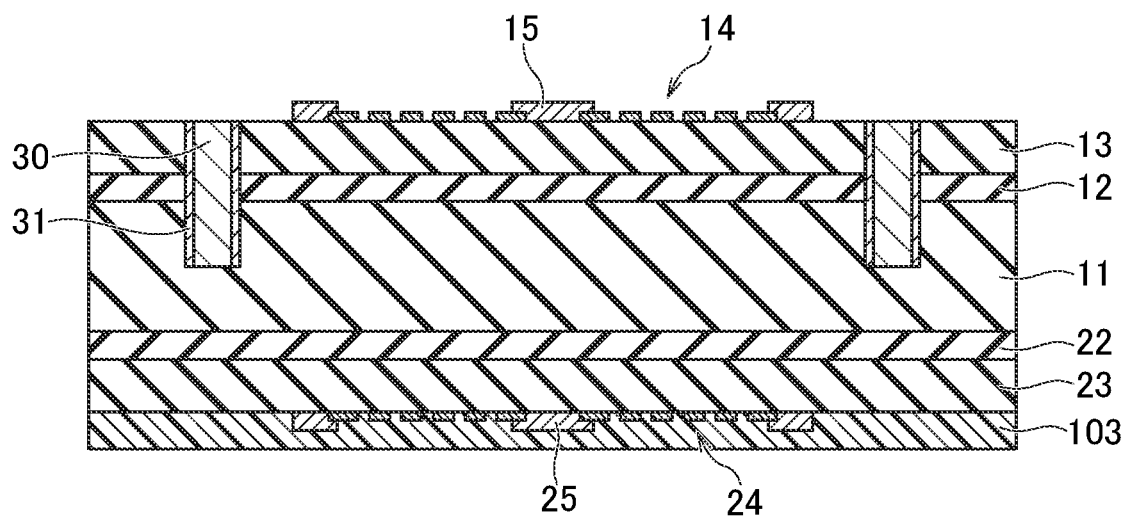
FIG. 6F is a cross-sectional view for describing step S19.

At step S19, as shown in FIG. 6F, a third protection film 103 of photoresist is formed on the bottom surface of the second piezoelectric layer 23 to at least partially cover (e.g., completely cover) the plurality of second IDT electrodes 24 and the second wiring layer 25 in the workpiece having the top surface of the first piezoelectric layer 13 and the bottom surface of the second piezoelectric layer 23 exposed by removing the first protection film 101 and the second protection film 102 at steps S17 and S18.

At step S1A, a photoresist pattern is formed on the top surface of the first piezoelectric layer 13 by a photolithography process in the workpiece having the third protection film 103 formed on the bottom surface of the second piezoelectric layer 23 at step S19. In particular, a photoresist is formed on the top surface of the first piezoelectric layer 13 to cover the plurality of first IDT electrodes 14 and the first wiring layer 15, and the photoresist is formed to have a certain pattern by a photolithography process. The photoresist on the top surface of the first piezoelectric layer 13 is formed to have a pattern that allows an area corresponding to the first terminal pad 32 formed on (e.g., directly on) the first end face of a through electrode 30 to be exposed.

At step S1B, metal can be provided by way of, for example a deposition process (e.g., a vapor deposition process) to form the first terminal pad 32 on the workpiece having a patterned photoresist on the first piezoelectric layer 13 at step S1A. Due to the vapor deposition of metal, a metal layer is deposited on the top surface of the first piezoelectric layer 13 covered with the patterned photoresist and the bottom surface of the second piezoelectric layer 23 covered with the third protection film 103. The metal to be vapor deposited can be copper, for example.

Figure 6G:
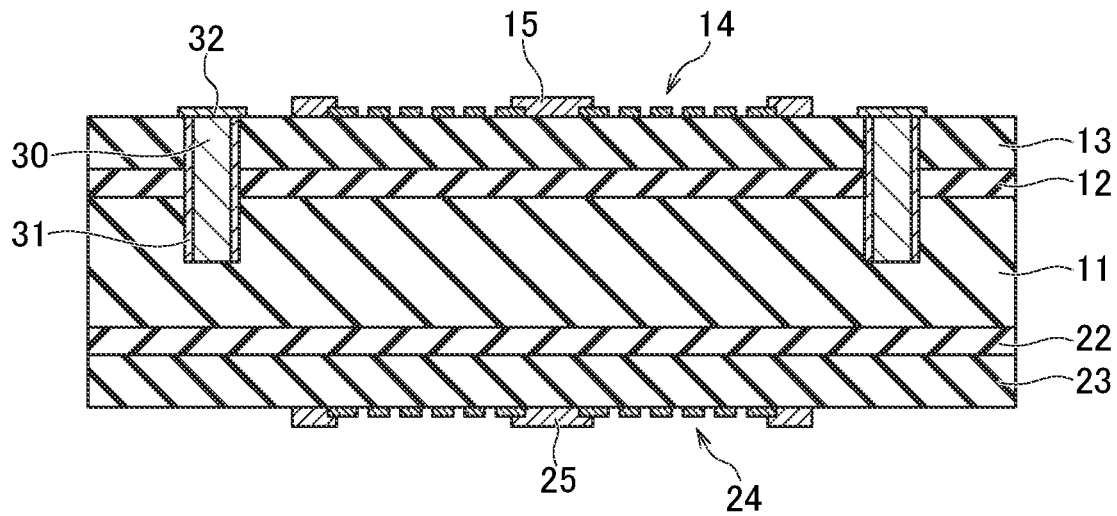
FIG. 6G is a cross-sectional view for describing steps S1A to S1C.

At step S1C, as shown in FIG. 6G, the metal deposited on the top surface of the first piezoelectric layer 13 at step S1B can be lifted-off to form the first terminal pad 32. On the top surface of the first piezoelectric layer 13, the patterned photoresist only exposes an area corresponding to the first terminal pad 32 formed directly on the first end face of a through electrode 30 and masks the remaining area. Accordingly, removing a metal layer deposited together with the photoresist may provide the first terminal pad 32 formed of metal layer. On the bottom surface of the second piezoelectric layer 23, removing the third protection film 103 may cause a metal layer deposited on the third protection film 103 to be removed. The first terminal pad 32 can at least partially overlap the through electrode 30. As shown in FIG. 6G, the first terminal pad 32 is formed directly on the first end face of a through electrode 30.

Figure 6H:
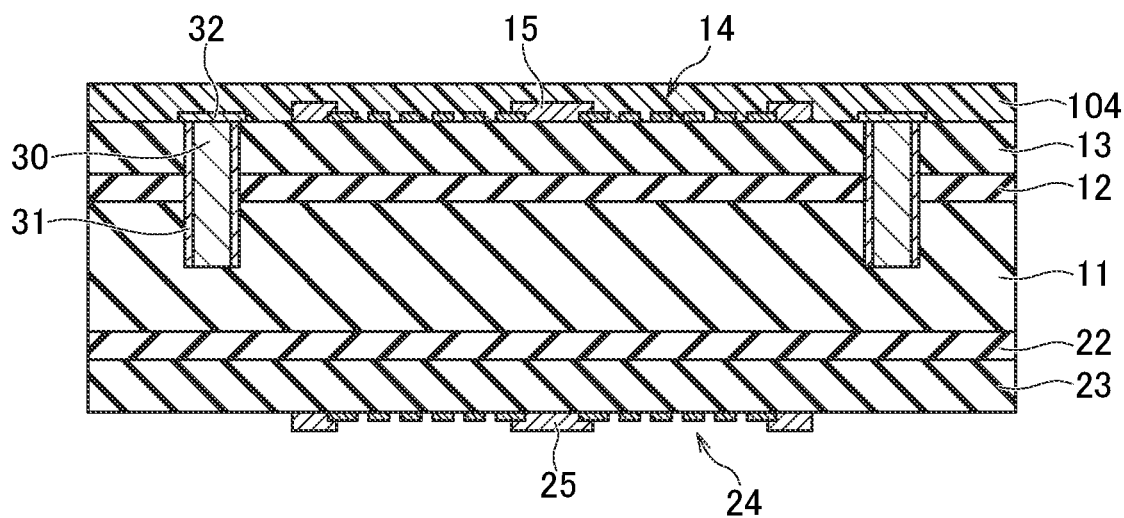
FIG. 6H is a cross-sectional view for describing step S1D.

At step S1D, as shown in FIG. 6H, a fourth protection film 104 of photoresist can be formed to at least partially cover (e.g., completely cover) the plurality of first IDT electrodes 14 and the first wiring layer 15 on the top surface of the first piezoelectric layer 13. In the workpiece shown in FIG. 6H, the fourth protection film 104 is formed on the first piezoelectric layer 13 to cover the plurality of first IDT electrodes 14 and the first wiring layer 15.

At step S1E, a photoresist pattern is formed on the bottom surface of the second piezoelectric layer 23 by a photolithography process in the workpiece having the fourth protection film 104 formed on the top surface of the first piezoelectric layer 13 at step S1D. A fifth protection film 105 of photoresist can be formed on the bottom surface of the second piezoelectric layer 23 to at least partially cover (e.g., completely cover) the plurality of second piezoelectric layer 24 and the second wiring layer 25. Using a photolithography process, the fifth protection film 105 is patterned to expose an area corresponding to a second end face of a through electrode 30 and mask the remaining area.

Figure 6I:
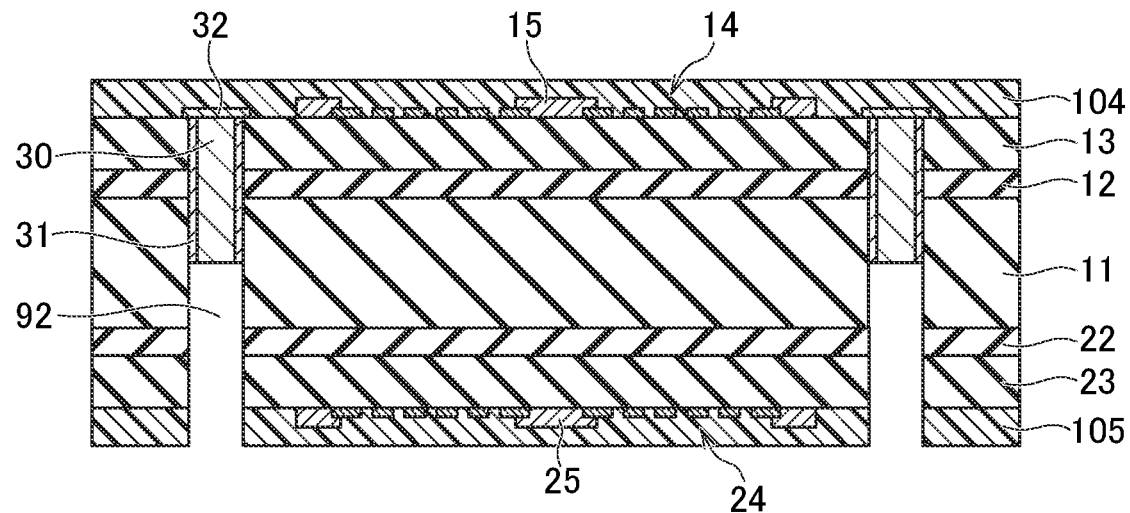
FIG. 6I is a cross-sectional view for describing steps S1E to S1F.

At step S1F, an etching process (e.g., a dry etching process) can be applied to the workpiece in which the top surface of the second piezoelectric layer 23 is covered with the patterned fifth protection film 105. In the workpiece shown in FIG. 6I, a second recess 92 has been formed at an area corresponding to the second end face of a through electrode 30 exposed from the second protection film 105 by the dry etching process. The second recess 92 can extend through the second piezoelectric layer 23, through the second dielectric layer 22, and partially through the substrate 11. For example, the second recess 92 extends from the bottom surface of the second piezoelectric layer 23 in the thickness direction of the substrate 11, extends through the second piezoelectric layer 23 and the second dielectric layer 22, and then reaches the metal filled up to the bottom portion of the first recess 91 in the middle of the substrate 11. The second recess 92 extends along generally the same axis and has generally the same diameter as the first recess 91 and accordingly is integrated with the first recess 91 to form a through hole. In some embodiments, the first recess 91 and the second recess 92 can be misaligned. In such embodiments, there may be a step formed between the first recess 91 and the second recess 92. It would be understood that the top surface of the first piezoelectric layer 13 of the workpiece is covered with the fourth protection film 104 and thus is not affected by the dry etching process.

Figure 6J:
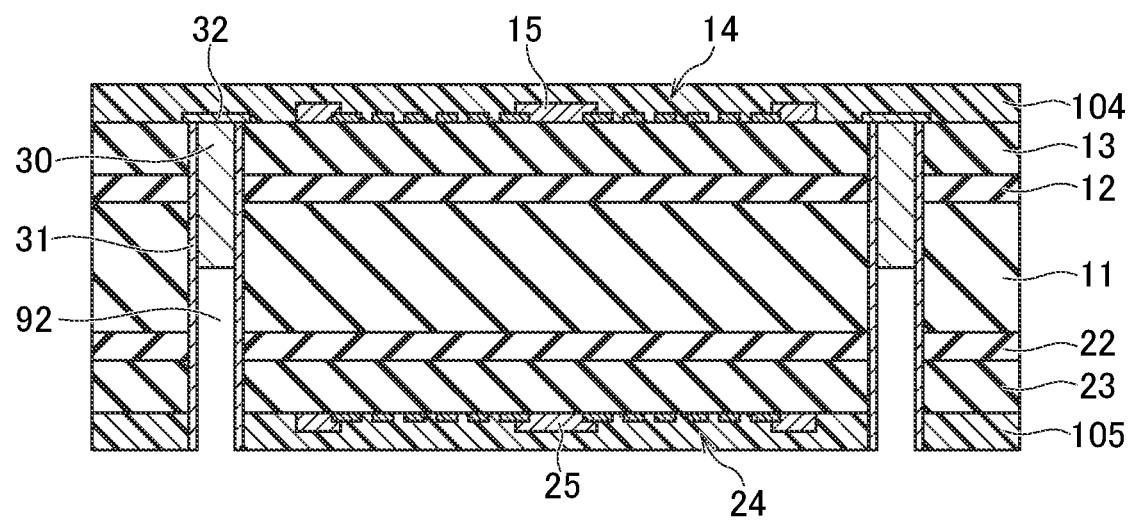
FIG. 6J is a cross-sectional view for describing step S1G.

At step S1G, a barrier layer 31 can be formed on a laterally peripheral surface within the second recess 92 formed at step S1F. The workpiece shown in FIG. 6J includes the barrier layer 31 formed to have a certain thickness over the laterally peripheral surface defined by the second recess 92.

At step S1H, a second seed layer (not shown) of metal such as copper can be formed on the second recess 92 having the barrier layer 31 formed at step 1G. The second seed layer is formed to cover the barrier layer 31 on the laterally peripheral surface and the bottom of the second recess 92.

Figure 6K:
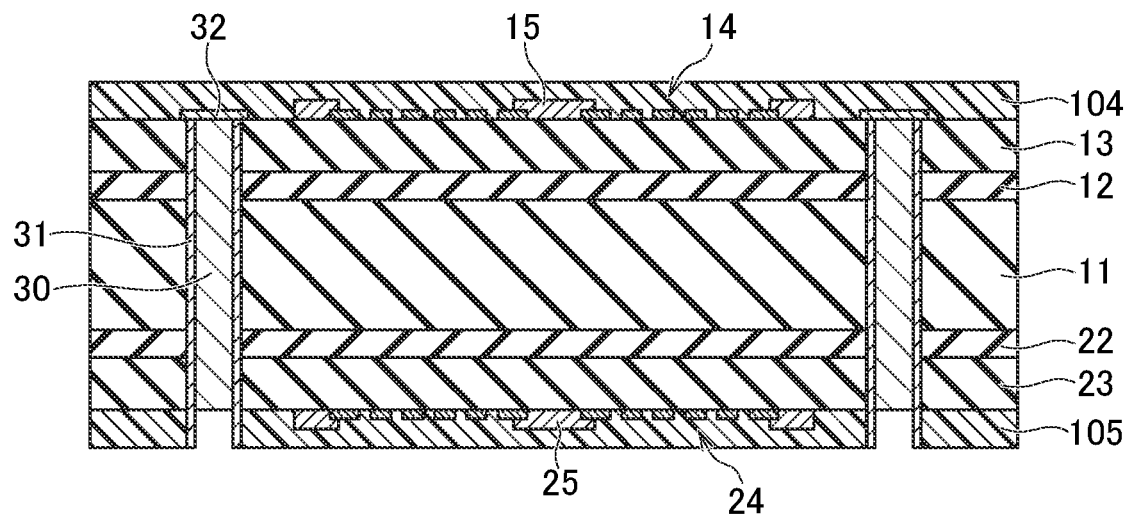
FIG. 6K is a cross-sectional view for describing steps S1H to S1I.

At step S1I, metal such as copper can be provided (e.g., deposited) on the second seed layer formed by plating or the like on the barrier layer 31 that is deposited on the lateral inner surface of the second recess 92 and on the bottom of the second recess 92 at step S1H. As shown in FIG. 6K, the deposited metal can be filled to reach the bottom surface of the second piezoelectric layer 23 along the barrier layer 31 covering the laterally peripheral surface from the bottom of the second recess 92. The metal filling the second recess 92 is integrated with the metal filling the first recess 91 to form a through electrode 30. In some embodiments, the metal can be conformally provided in the second recess 92 to define a conformal via as the through electrode 30. A structure indicative of the multi-step process of forming the through electrode 30 can be present. For example, an intersection between the portion of the through electrode 30 in the first recess 91 and the portion of the through electrode 30 in the second recess 92 can be detectible. When the first recess 91 and the second recess 92 are misaligned, the step formed between the first recess 91 and the second recess 92 can be an indication of the multi-step process. In some instances, the misalignment can be within the thickness of the barrier layer 31.

At step S1J, the fourth protection film 104 and the fifth protection film 105 of photoresist can be removed from the workpiece having a plurality of through electrodes 30 formed by filling the second recess 92 with metal at step S1I. Thus, a suitable solution is used for peeling and removing the photoresists of the fourth protection film 104 and the fifth protection film 105.

Figure 6L:
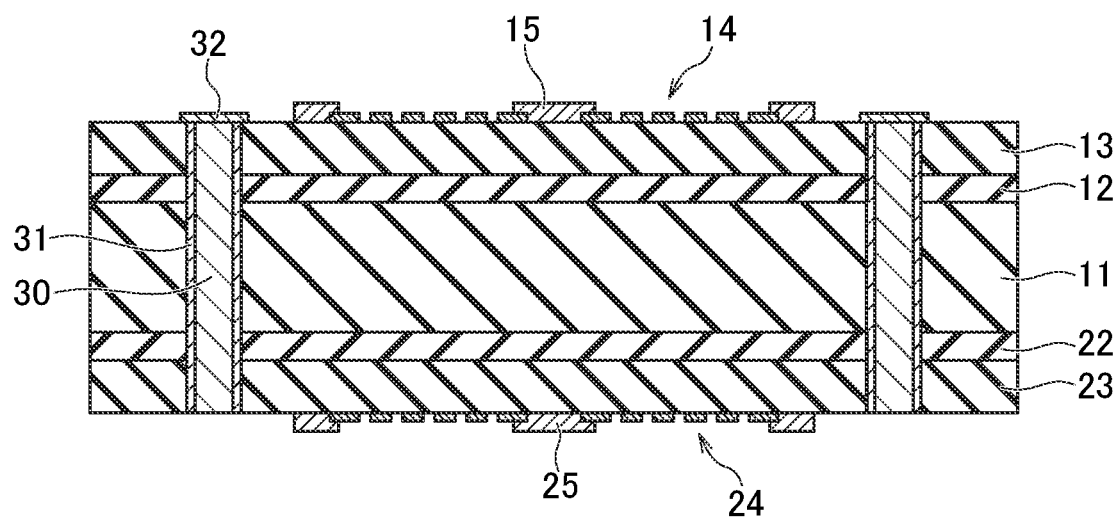
FIG. 6L is a cross-sectional view for describing steps S1J to S1K.

At step S1K, some of the photoresists of the fourth protection film 104 and the fifth protection film 105, which were not removed and remain in the workpiece regardless of peeling and removing the first protection film 104 and the second protection film 105 at step S17, are dissolved and removed by an ashing process. As shown in FIG. 6L, the fourth protection film 104 and the fifth protection film 105 are removed and the top surface of the first piezoelectric layer 13 and the bottom surface of the second piezoelectric layer 23 are exposed.

Figure 6M:
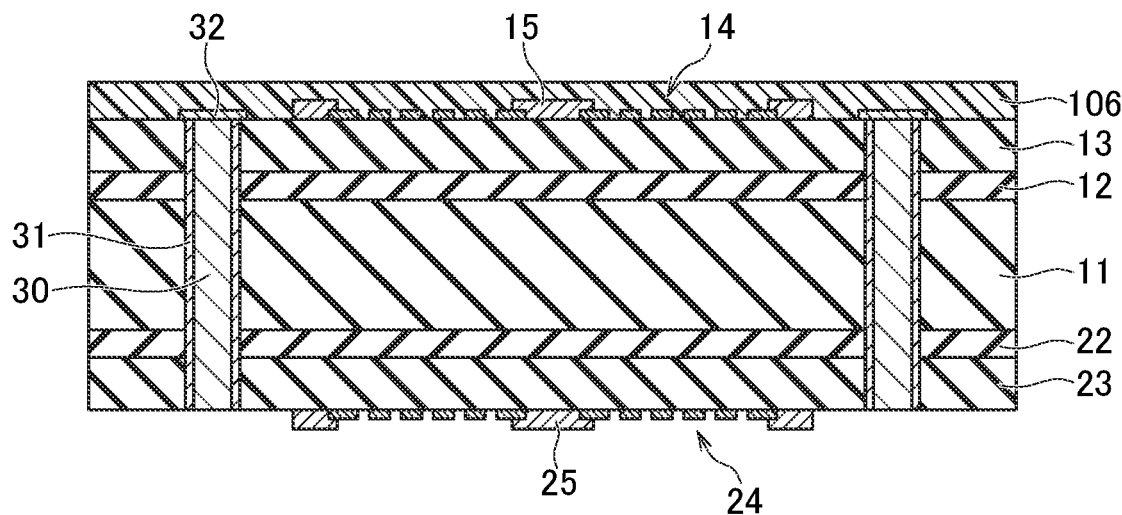
FIG. 6M is a cross-sectional view for describing steps S1J to S1K.
Figure 6N:
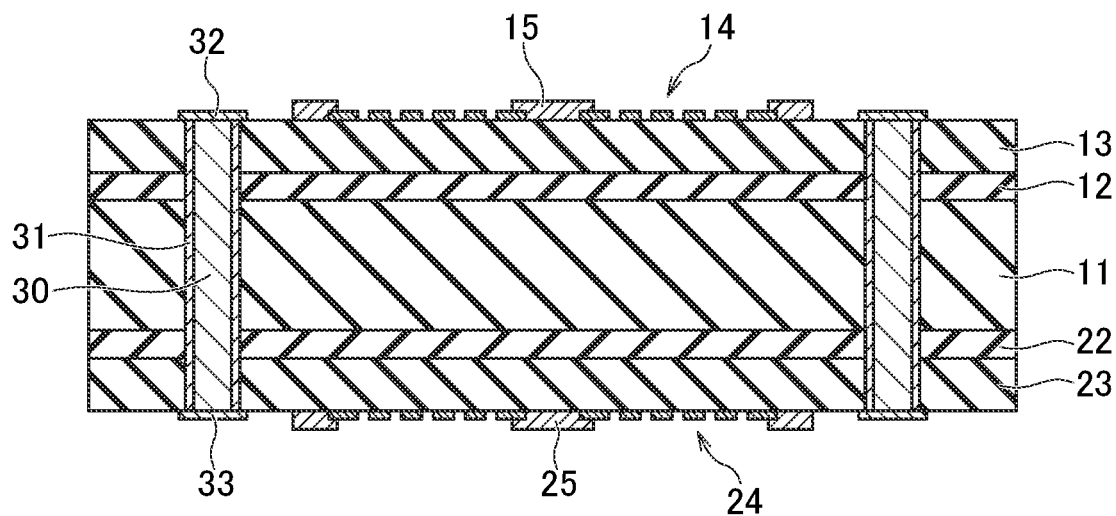
FIG. 6N is a cross-sectional view for describing steps S1M to S1O.

At step S1L, as shown in FIG. 6M, a sixth protection film 106 of photoresist is formed on the top surface of the first piezoelectric layer 13 to at least partially cover (e.g., completely cover) the plurality of first IDT electrodes 14 and the first wiring layer 15 in the workpiece having the top surface of the first piezoelectric layer 13 and the bottom surface of the second piezoelectric layer 23 exposed by removing the fourth protection film 104 and the fifth protection film 105 at steps S1J and S1K.

At step S1M, a photoresist pattern is formed on the bottom surface of the second piezoelectric layer 23 by a photolithography process in the workpiece having the sixth protection film 106 formed on the top surface of the first piezoelectric layer 13 at step S1L. In particular, a photoresist is formed on the bottom surface of the second piezoelectric layer 23 to cover the plurality of second IDT electrodes 24 and the second wiring layer 25, and the photoresist is formed to have a certain pattern by a photolithography process. The photoresist on the bottom surface of the second piezoelectric layer 23 is formed to have a pattern that allows an area corresponding to the second terminal pad 33 formed directly on the second end face of a through electrode 30 to be exposed.

At step S1N, metal can be provided (e.g., vapor deposited) to form the second terminal pad 33 shown in FIG. 6N on the workpiece having a patterned photoresist on the bottom surface of the second piezoelectric layer 23 at step S1M. Due to the vapor deposition of metal, a metal layer is deposited on the bottom surface of the second piezoelectric layer 23 covered with the patterned photoresist and the top surface of the first piezoelectric layer 13 covered with the sixth protection film 106 (see FIG. 6M). The metal to be vapor deposited can be copper, for example.

At step S1O, the metal deposited on the bottom surface of the second piezoelectric layer 23 at step S1N can be lifted-off to form the second terminal pad 33. On the bottom surface of the second piezoelectric layer 23, the patterned photoresist only exposes an area corresponding to the second terminal pad 33 formed directly on the second end face of a through electrode 30 and masks the remaining area. Accordingly, removing a metal layer deposited together with the photoresist may provide the second terminal pad 33 formed of metal layer. Then, on the top surface of the first piezoelectric layer 13, removing the sixth protection film 106 may cause a metal layer deposited on the sixth protection film 106 to be removed. The second terminal pad 33 can at least partially overlap the through electrode 30. As shown in FIG. 6N, the first terminal pad 32 is formed directly on the first end face of a through electrode 30 exposed on the top surface of the first piezoelectric layer 13, and the second terminal pad 33 is formed directly on the second end face of the through electrode 30 exposed on the bottom surface of the second piezoelectric layer 23.

Figure 7:
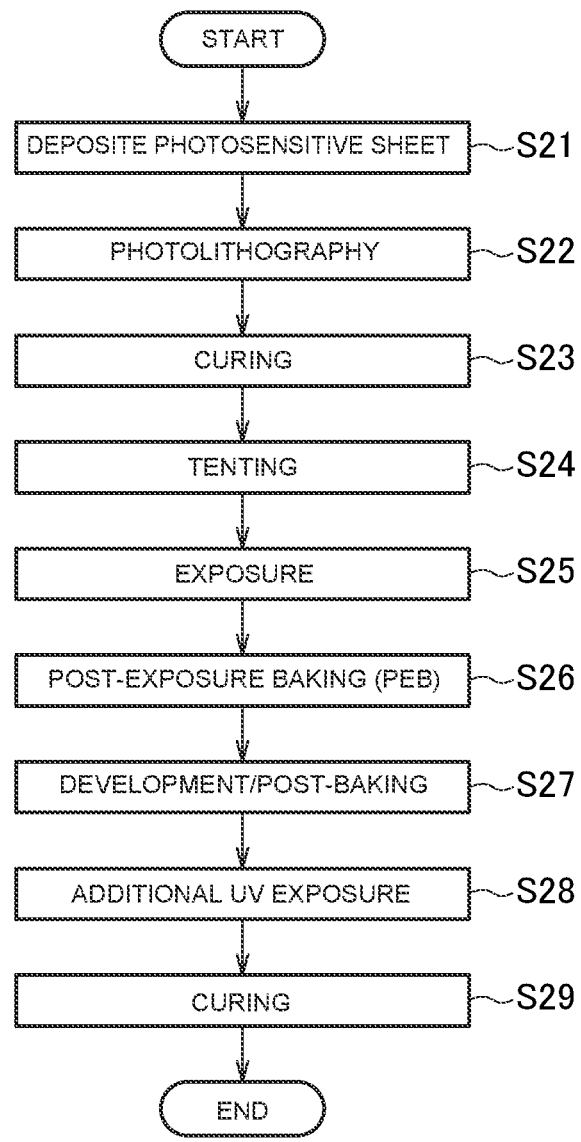
FIG. 7 is a flow diagram showing a series of steps included in step S2.

Returning to FIG. 4, a cavity roof can be formed at step S2 subsequent to forming the plurality of through electrodes 30 at step S1. The cavity roof herein refers to the cavity roof 19 supported by the first cavity frame 18 formed on the top surface of the first piezoelectric layer 13. Step S2 includes steps S21 to S29 of FIG. 7. It should be appreciated that the step of forming the second cavity roof 29 supported by the second cavity frame 28 formed on the bottom surface of the second piezoelectric layer 23 is included in step S3 as discussed below.

Figure 8A:
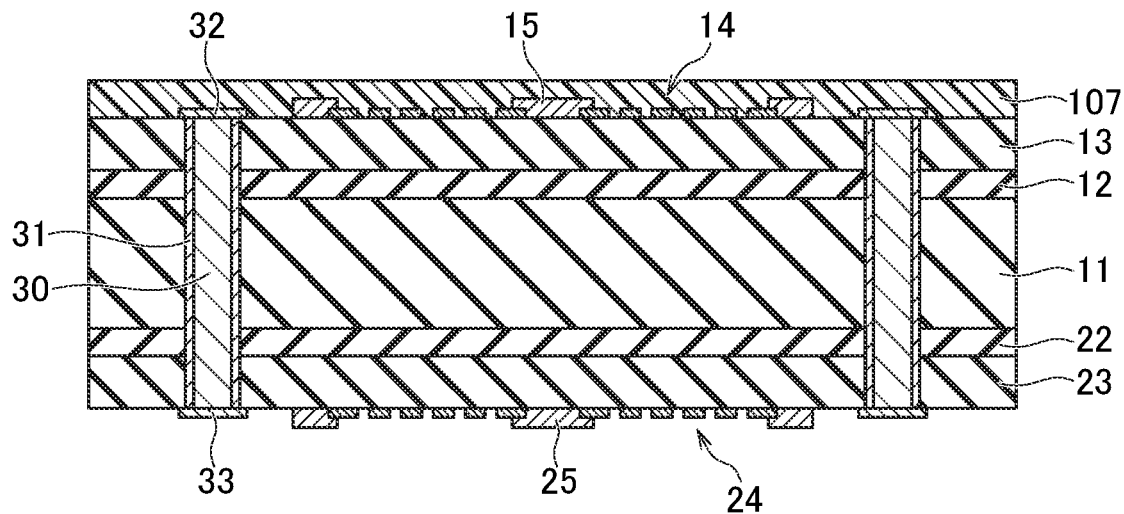
FIG. 8A is a cross-sectional view for describing step S21.

At step S21, the workpiece obtained at Step S1O included in Step S1, in which the plurality of through electrodes 30 are formed and the first terminal pad 32 and the second terminal pad 33 are formed respectively on the first end face and the second end face of a through electrode 30, is processed. In the workpiece, a first photosensitive resin sheet 107 having a certain thickness is provided (e.g., deposited) to at least partially cover (e.g., completely cover) the plurality of first IDT electrodes 14, the first wiring layer 15, the plurality of through electrodes 30, and the first terminal pad 32 that is formed on the top surfaces of at least some of the through electrodes 30. As shown in FIG. 8A, the top surface of the first piezoelectric layer 13 is covered with the first photosensitive resin sheet 107 in the workpiece. The first photosensitive resin sheet 107 may be a polyimide-based photosensitive resin sheet or an epoxy-based photosensitive resin sheet, for example.

At step S22, a photolithography process is applied to the workpiece having the top surface of the first piezoelectric layer 13 covered with the first photosensitive resin sheet 107 at step S21. Using the photolithography process, a portion of the first photosensitive resin sheet 107 covering the top surface of the first piezoelectric layer 13 remains and the other portions can be removed. The remaining portion of the first photosensitive resin sheet 107 extends along the periphery of the top surface of the first piezoelectric layer 13 and has a width and a height on the top surface of the first piezoelectric layer 13 to enclose the first IDT electrodes 14, the first wiring layer 15, the though electrodes 30, and the first terminal pad 32 formed on the top surfaces of at least some of the through electrodes 30.

Figure 8B:
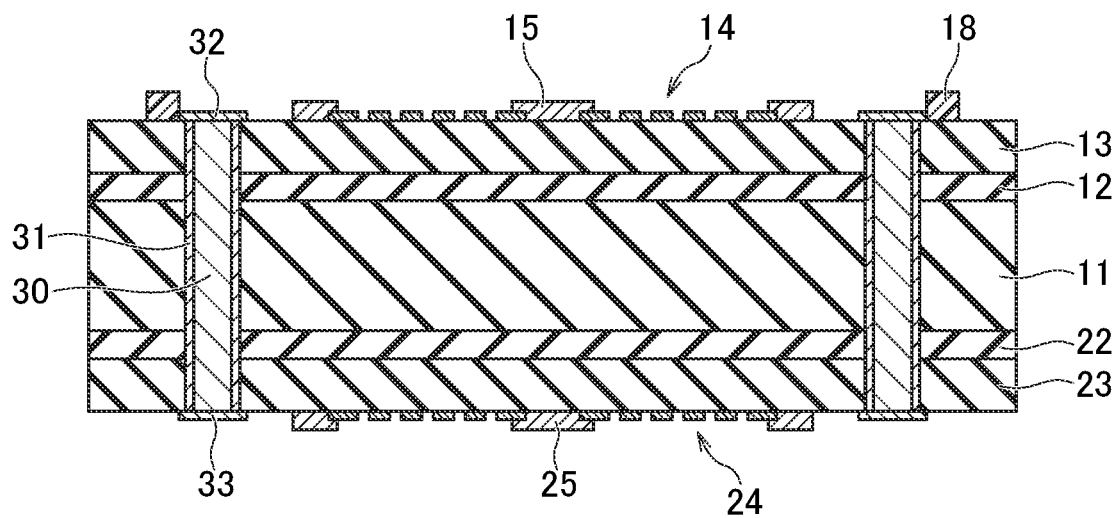
FIG. 8B is a cross-sectional view for describing steps S22 to S23.

At step S23, the first photosensitive resin sheet 107, which includes the portion remaining at step S22 that extends along the periphery of the top surface of the first piezoelectric layer 13 and has a width and a height, is cured and the first cavity frame 18 can be formed. As shown in FIG. 8B, the first cavity frame 18 having a width and a height is formed along the periphery of the top surface of the first piezoelectric layer 13. On the top surface of the first piezoelectric layer 13, the first cavity frame 18 can laterally surround the first IDT electrodes 14, the first wiring layer 15, the through electrodes 30, and the first terminal pad 32 that is formed on the top surfaces of at least some of the through electrodes 30. In some embodiments, the first cavity frame 18 can be a continuous ring. The first cavity frame 18 is formed to maintain the height from the top surface of the first piezoelectric layer 13 such that the top surface of the first piezoelectric layer 13, the first cavity frame 18, and the first cavity roof 19, which is supported by the first cavity frame 18, can define a first cavity 16 as discussed below. The first cavity 16 can house the first IDT electrodes 14, the first wiring layer 15, the through electrodes 30, the first terminal pad 32, and the like.

Figure 8C:
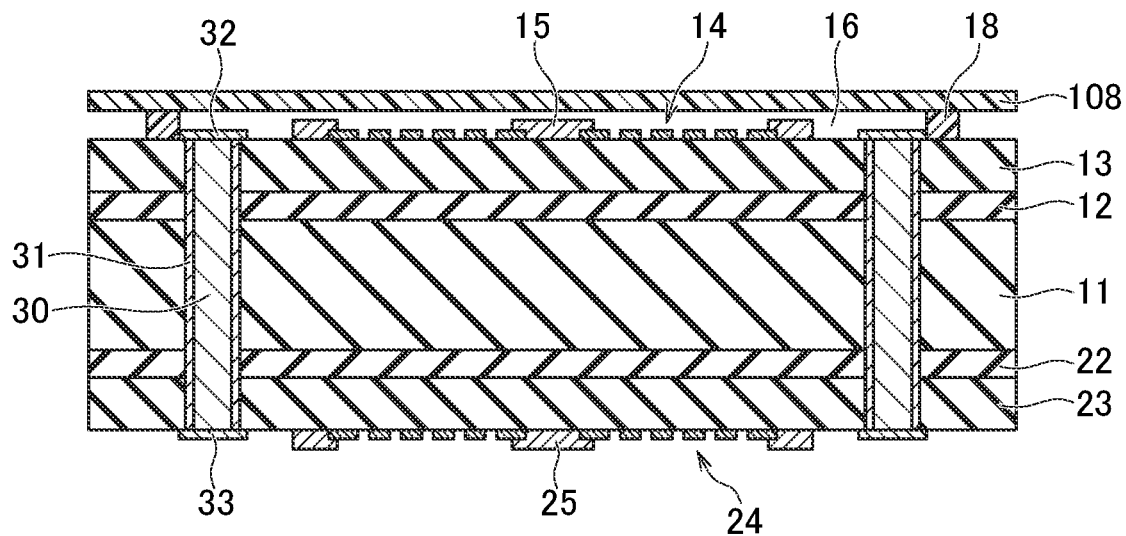
FIG. 8C is a cross-sectional view for describing step S24.

At step S24, a second photosensitive resin sheet 108 having a certain thickness can be disposed to cover the top surface of the first piezoelectric layer 13 in the workpiece having the first cavity frame 18 formed on the top surface of the first piezoelectric layer 13 at step S23. As shown in FIG. 8C, the first cavity frame 18 can be formed on the top surface of the first piezoelectric layer 13 to have a certain height such that the second photosensitive resin sheet 108 is supported by the first cavity frame 18 in a tent-like structure at a certain level from the top surface of the first piezoelectric layer 13. The second photosensitive resin sheet 108 supported by the first cavity frame 18 extends as a planar plate and is configured to be rigid enough to prevent hanging down toward the top surface of the first piezoelectric layer 13 and contacting the first IDT electrodes 14, the first wiring layer 15, the through electrodes 30, the first terminal pad 32, and the like. The top surface of the first cavity frame 18 can be bonded to the bottom surface of the second photosensitive resin sheet 108 by adhesive or the like. The second photosensitive resin sheet 108 may be a polyimide-based photosensitive resin sheet or an epoxy-based photosensitive resin sheet, for example.

At step S25, an exposure process using a suitable mask can be applied to the second photosensitive resin sheet 108 disposed on the first cavity frame 18 at step S24 such that portions of the resin sheet 108 are cured. For example, at least the portions of the resin sheet 108 that are located laterally inside the first cavity frame 18 and directly above the top surface of the first cavity frame 18 are cured to define the first cavity roof 19. Conversely, a portion of the second photosensitive resin sheet 108 located outside the first cavity frame 18 not to form the first cavity roof 19 may be exposed, and portions of the second photosensitive resin sheet 108 located inside the first cavity frame 18 and directly above the top surface to form the first cavity roof 19 may not be cured.

At step S26, a post-exposure baking (PEB) process can be applied to the workpiece having the second photosensitive resin sheet 108 exposed at step S25 such that the exposed portions of the second photosensitive resin sheet 108 is heated to promote a chemical reaction such as cross-linking reaction on the exposed portions. The PEB may promote a chemical reaction on a portion that was not exposed.

At step S27, the workpiece having experienced the PEB process at step S26 can be dipped in developing solution such that a portion that is located outside of the first cavity frame 18 and was not exposed in the second photosensitive resin sheet 108 is removed by the developing solution. Conversely, a portion of the second photosensitive resin sheet 108 located outside the first cavity frame 18 not to form the first cavity roof 19 may be exposed, and, when the portions of the second photosensitive resin sheet 108 located inside the first cavity frame 18 and directly above the top surface were not exposed, the exposed portion located outside the first cavity frame 18 may be removed by developing solution. After the developing process, developing solution and the like remaining on the developed workpiece can be heated and removed by a post baking process.

At step S28, an additional ultraviolet exposure process can be applied to the workpiece having experienced the developing and post baking processes at step S27. In the workpiece, the second photosensitive resin sheet 108 can be disposed inside the first cavity frame 18 formed on the top surface of the first piezoelectric layer 13 and directly above the top surface. The additional ultraviolet exposure process can promote a chemical reaction such as cross-linking in the resin forming the second photosensitive resin sheet 108.

Figure 8D:
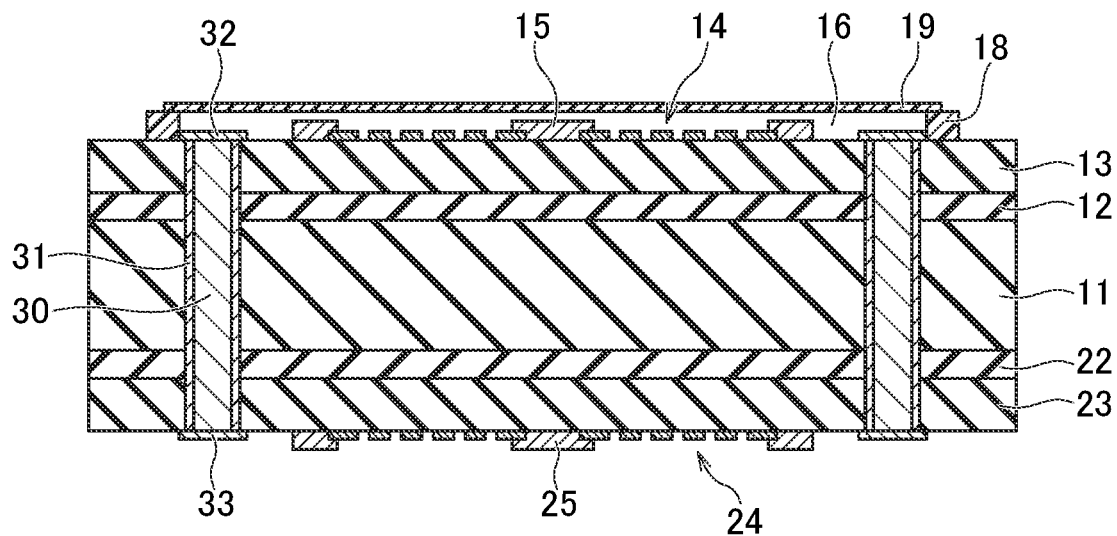
FIG. 8D is a cross-sectional view for describing steps S25 to S29.

At step S29, the second photosensitive resin sheet 108 can be cured in the workpiece having experienced the additional ultraviolet exposure process at step S28. The second photosensitive resin sheet 108 can be cured by heating up to a certain temperature. The cured second photosensitive resin sheet 108 forms the first cavity roof 19. As shown in FIG. 8D, the first cavity roof 19 is supported at a certain height by the first cavity frame 18 formed on the top surface of the first piezoelectric layer 13. The top surface of the first piezoelectric layer 13, the first cavity frame 18, and the first cavity roof 19 define a first cavity 16 enclosing the first IDT electrodes 14 and the first wiring layer 15 on the top surface of the first piezoelectric layer 13, the through electrodes 30, and the first terminal pad 32 formed on the top surfaces of at least some of the through electrodes 30. In some embodiments, the first cavity frame 18, and the first cavity roof 19 can be arranged to hermetically seal the first cavity 16.

Figure 9A:
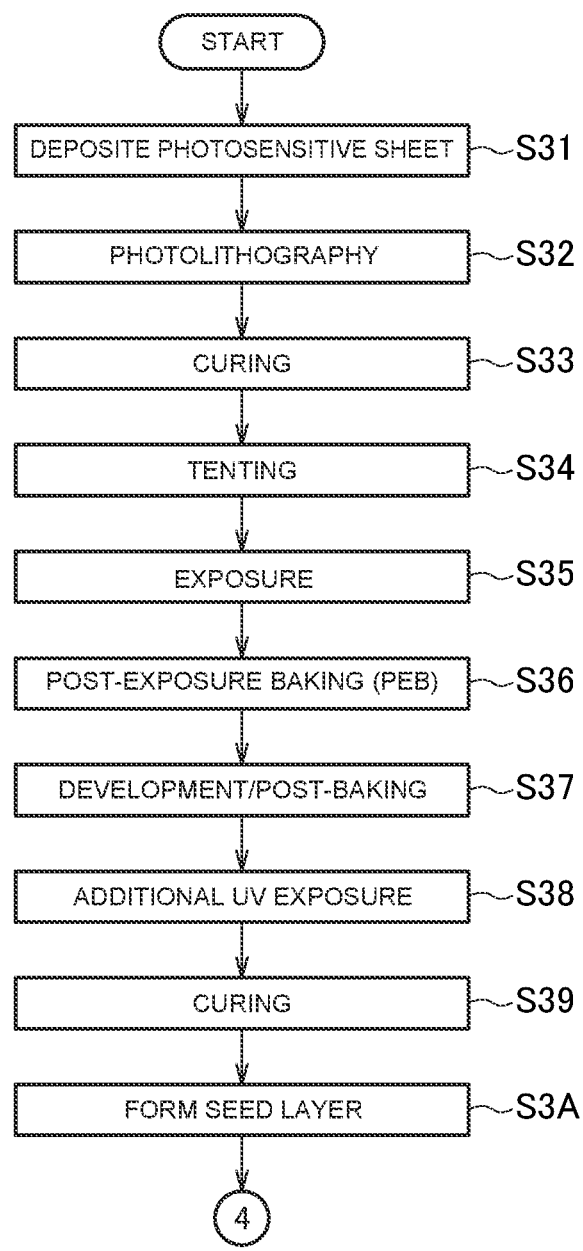
FIG. 9A is a flow diagram showing steps S31 to S3A included in S3.
Figure 9B:
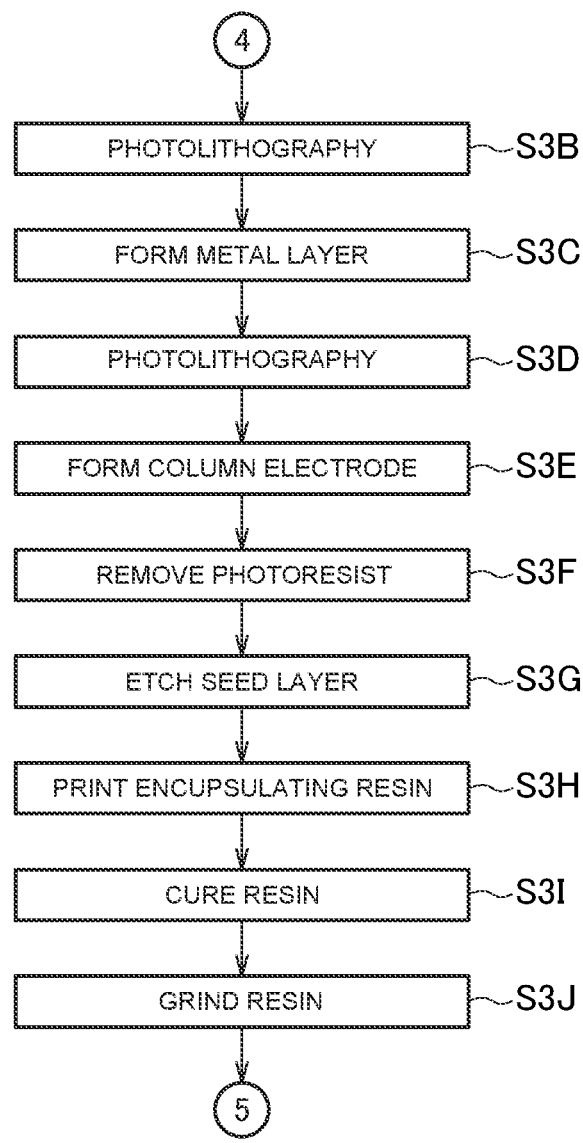
FIG. 9B is a flow diagram showing steps S3B to S3J included in S3.
Figure 9C:
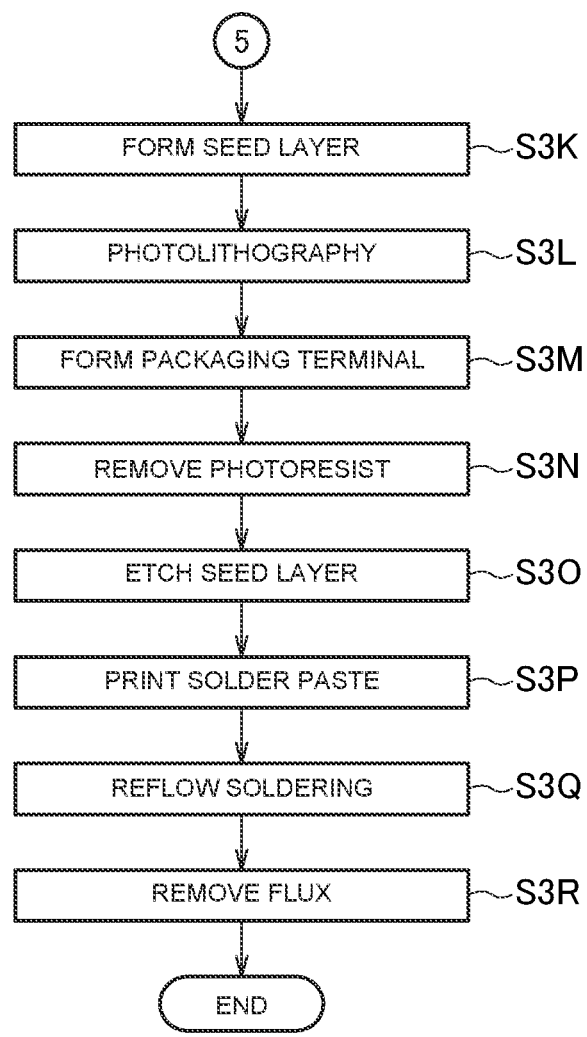
FIG. 9C is a flow diagram showing steps S3K to S3R included in S3.

Returning to FIG. 4, a back-side package can be formed at step 3 subsequent to forming the first cavity roof 19 at step S2. Step S3 includes steps S31 to S3A of FIG. 9A, steps S3B to S3J of FIG. 9B, and steps S3K to S3R of FIG. 9C.

Figure 10A:
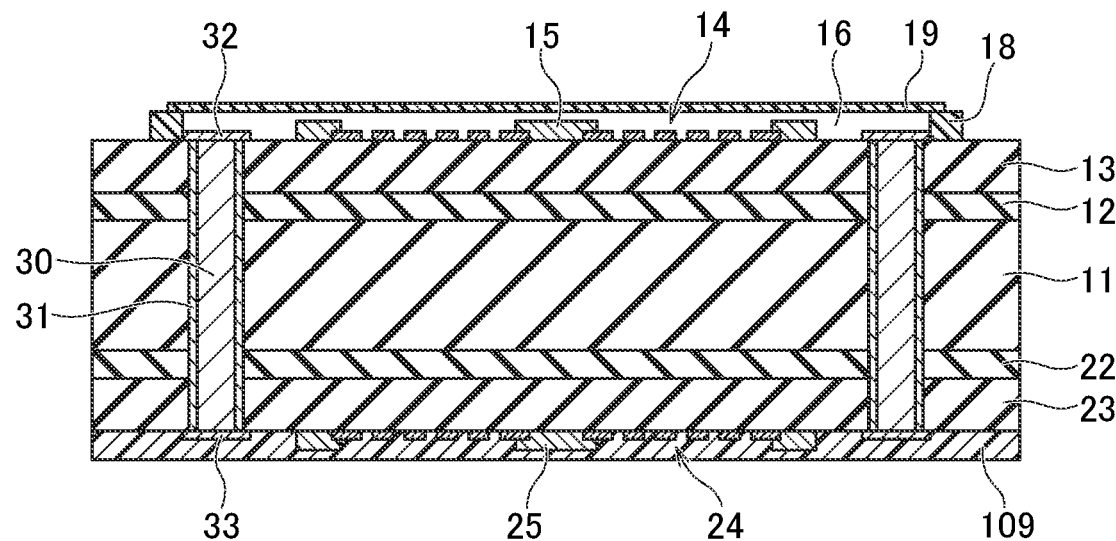
FIG. 10A is a cross-sectional view for describing step S31.

At step S31, the workpiece having the first cavity roof 19 supported by the first cavity frame 18 formed on the first piezoelectric layer 13 at Step S29 is processed. In the workpiece, a third photosensitive resin sheet 109 having a certain thickness can be provided (e.g., deposited) to at least partially cover (e.g., completely cover) the plurality of second IDT electrodes 24, the second wiring layer 25, the plurality of through electrodes 30, and the second terminal pad 33 that is formed on the top surfaces of at least some of the through electrodes 30 as shown in FIG. 10A. As shown in FIG. 10A, the bottom surface of the second piezoelectric layer 23 is covered with the third photosensitive resin sheet 109 in the workpiece. The third photosensitive resin sheet 109 may be a polyimide-based photosensitive resin sheet or an epoxy-based photosensitive resin sheet, for example.

At step S32, a photolithography process can be applied to the workpiece having the bottom surface of the second piezoelectric layer 23 covered with the third photosensitive resin sheet 109 at step S31. Using the photolithography process, a portion of the third photosensitive resin sheet 109, which has a width and a height to extend along a periphery of the bottom surface of the second piezoelectric layer 23 and covers the second IDT electrodes 24, the second wiring layer 25, and the like formed on the bottom surface of the second piezoelectric layer 23, remains and the other portions are removed.

Figure 10B:
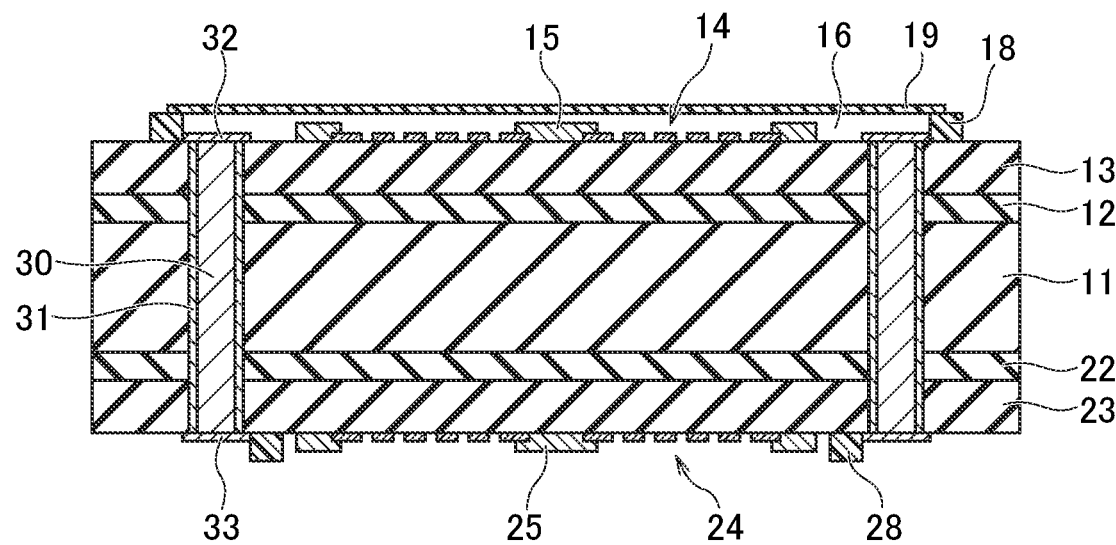
FIG. 10B is a cross-sectional view for describing steps S32 to S33.

At step S33, the third photosensitive resin sheet 109, which includes the portion remaining at step S32 that extends along the periphery of the bottom surface of the second piezoelectric layer 23 and has a width and a height, can be cured and a second cavity frame 28 can be formed. As shown in FIG. 10B, the second cavity frame 28 having a width and a height is formed along the periphery of the bottom surface of the second piezoelectric layer 23. The second cavity frame 28 can laterally surround the second IDT electrodes 24, the second wiring layer 25, and the like on the bottom surface of the second piezoelectric layer 23. In some embodiments, the second cavity frame 28 can be a continuous ring. The second cavity frame 28 is formed to maintain the height from the bottom surface of the second piezoelectric layer 23 such that the bottom surface of the second piezoelectric layer 23, the second cavity frame 28, and the second cavity roof 29, which is supported by the second cavity frame 28, can define a second cavity 26 as discussed below. The second cavity 26 can house the second IDT electrodes 24, the second wiring layer 25, and the like.

Figure 10C:
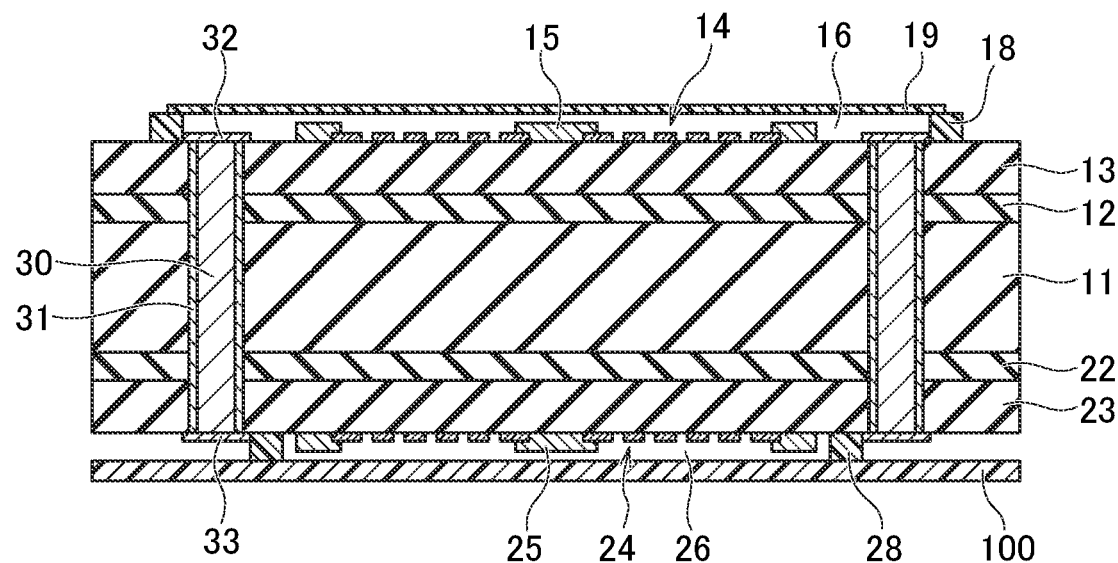
FIG. 10C is a cross-sectional view for describing step S34.

At step S34, a fourth photosensitive resin sheet 100 having a certain thickness can be disposed to cover the bottom surface of the second piezoelectric layer 23 in the workpiece having the second cavity frame 28 formed at step S23. As shown in FIG. 10C, the second cavity frame 28 can be formed on the bottom surface of the second piezoelectric layer 23 to have a certain height such that the fourth photosensitive resin sheet 100 is supported by the second cavity frame 28 in a tent-like structure at a certain level from the bottom surface of the second piezoelectric layer 23. The fourth photosensitive resin sheet 100 supported by the second cavity frame 28 extends as a planar plate and is configured to be rigid enough to prevent hanging down toward the bottom surface of the second piezoelectric layer 23 and contacting the second IDT electrodes 24, the second wiring layer 25, and the like. The bottom surface of the second cavity frame 28 can be bonded to the top surface of the fourth photosensitive resin sheet 100 by adhesive or the like.

At step S35, an exposure process using a suitable mask can be applied to the fourth photosensitive resin sheet 100 disposed on the second cavity frame 28 at step S34 such that portions of the resin sheet 100 located inside the second cavity frame 28 and directly below the bottom surface to form the second cavity roof 29 can be cured. Conversely, a portion of the fourth photosensitive resin sheet 100 located outside the second cavity frame 28 not to form the second cavity roof 29 may be exposed, and portions of the fourth photosensitive resin sheet 100 located inside the second cavity frame 28 and directly below the bottom surface to form the second cavity roof 29 may not be cured.

At step S36, a post-exposure baking (PEB) process can be applied to the workpiece having the fourth photosensitive resin sheet 100 exposed at step S35 such that the exposed portions of the fourth photosensitive resin sheet 100 is heated to promote a chemical reaction such as cross-linking reaction on the exposed portions. The PEB may promote a chemical reaction on a portion that was not exposed.

At step S37, the workpiece having experienced the PEB process at step S36 can be dipped in developing solution such that a portion that is located outside of the second cavity frame 28 and was not exposed in the fourth photosensitive resin sheet 100 is removed by the developing solution. Conversely, a portion of the fourth photosensitive resin sheet 100 located outside the second cavity frame 28 not to form the second cavity roof 29 may be exposed, and, when the portions of the fourth photosensitive resin sheet 100 located inside the second cavity frame 28 and directly below the bottom surface were not exposed, the exposed portion located outside the second cavity frame 28 may be removed by developing solution. After the developing process, developing solution and the like remaining on the developed workpiece can be heated and removed by a post baking process.

At step S38, an additional ultraviolet exposure process can be applied to the workpiece having experienced the developing and post baking processes at step S37. In the workpiece, the fourth photosensitive resin sheet 100 can be disposed inside the second cavity frame 28 formed on the bottom surface of the second piezoelectric layer 23 and directly below the bottom surface. The additional ultraviolet exposure process can promote a chemical reaction such as cross-linking in the resin forming the fourth photosensitive resin sheet 100.

Figure 10D:
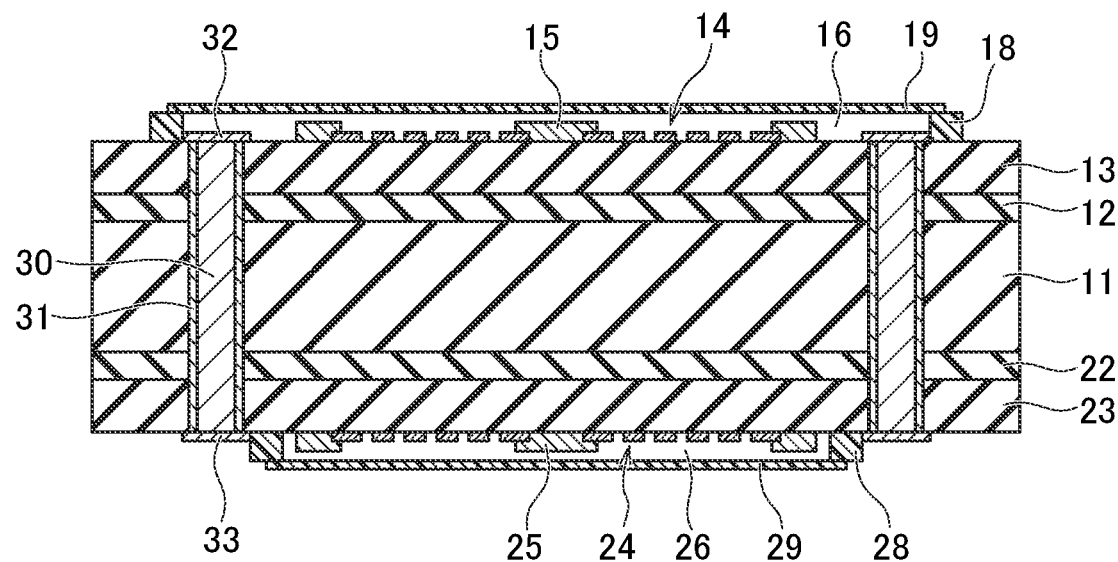
FIG. 10D is a cross-sectional view for describing steps S35 to S39.

At step S39, the fourth photosensitive resin sheet 100 can be cured in the workpiece having experienced the additional ultraviolet exposure process at step S38. The fourth photosensitive resin sheet 100 can be cured by heating up to a certain temperature. The cured fourth photosensitive resin sheet 100 forms the second cavity roof 29. As shown in FIG. 10D, the second cavity roof 29 is supported at a certain height by the second cavity frame 28 formed on the bottom surface of the second piezoelectric layer 23. The bottom surface of the second piezoelectric layer 23, the second cavity frame 28, and the second cavity roof 29 define the second cavity 26 surrounding the second IDT electrodes 24, the second wiring layer 25, and the like formed on the bottom surface of the second piezoelectric layer 23. In some embodiments, the second cavity frame 28, and the second cavity roof 28 can be arranged to hermetically seal the second cavity 26.

Figure 10E:
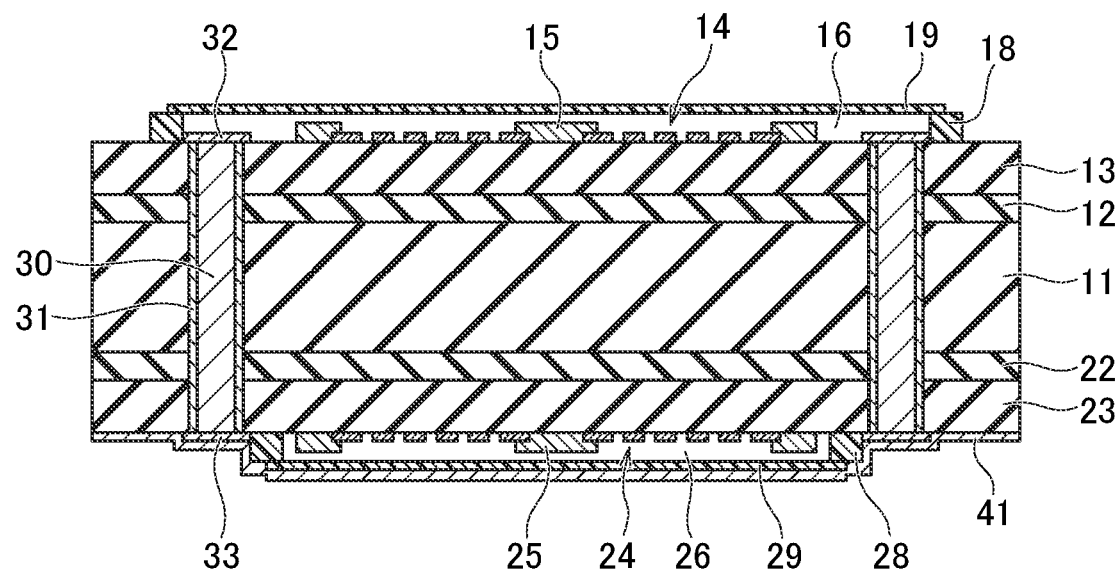
FIG. 10E is a cross-sectional view for describing step S3A.

At step S3A, as shown in FIG. 10E, a third seed layer 41 can be formed by, for example, a sputtering process or the like in the workpiece having the second cavity roof 29 formed at step S39 to cover the second terminal pad 33 that is formed directly on the second end faces of some of the through electrodes 30, the second cavity frame 28, and the second cavity roof 29 formed on the bottom surface of the second piezoelectric layer 23.

At step S3B, a photolithography process can be applied to the workpiece having the third seed layer 41 formed on the bottom surface of the second piezoelectric layer 23 at step S3A. Specifically, the third seed layer 41 is at least partially covered (e.g., completely covered) with a seventh protection film 95, and then, using a photolithography process, a first opening can be formed in the seventh protection film 95 to expose the third seed layer 41 in a certain pattern corresponding to a third wiring layer 42 as discussed below.

Figure 10F:
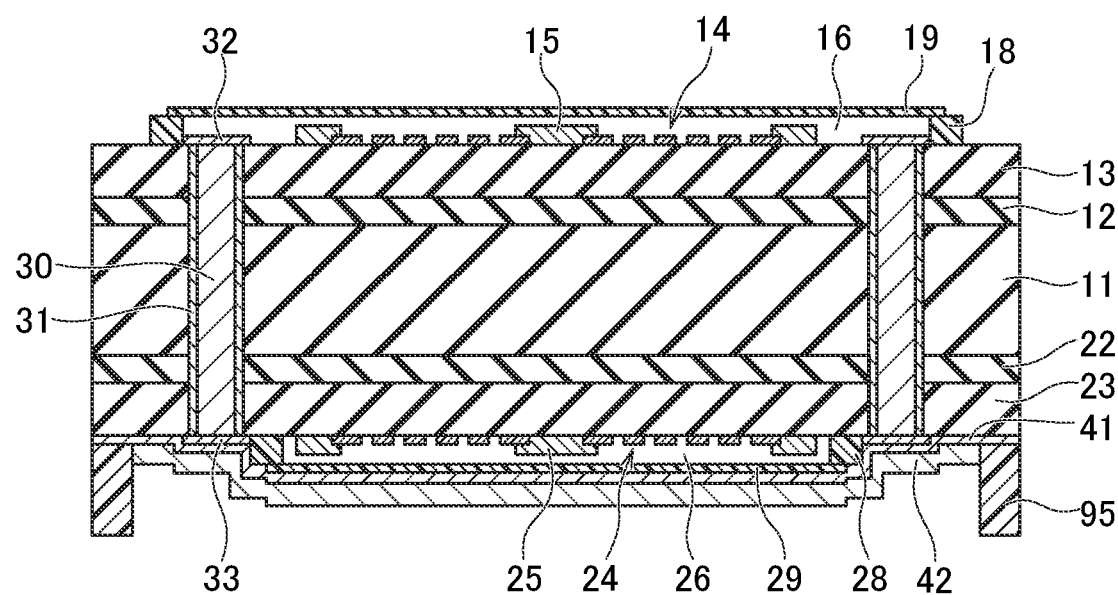
FIG. 10F is a cross-sectional view for describing steps S3B to S3C.

At step S3C, a metal layer such as copper layer can be provided (e.g., deposited) by plating on the third seed layer 41 exposed in the pattern of the third wiring layer 42 in the workpiece having the seventh protection film 95 formed at step S3B. As shown in FIG. 10F, the metal deposition on the third seed layer 41 can be blocked by the seventh protection film 95 covering the third seed layer 41 and thus the metal layer may be formed only on an opening portion in the seventh protection film 95 to expose the third seed layer 41. The seventh protection film 95 can be patterned to have a predetermined-shaped opening such that the third wiring layer 42 is formed in a shape corresponding to the opening pattern.

Figure 10G:
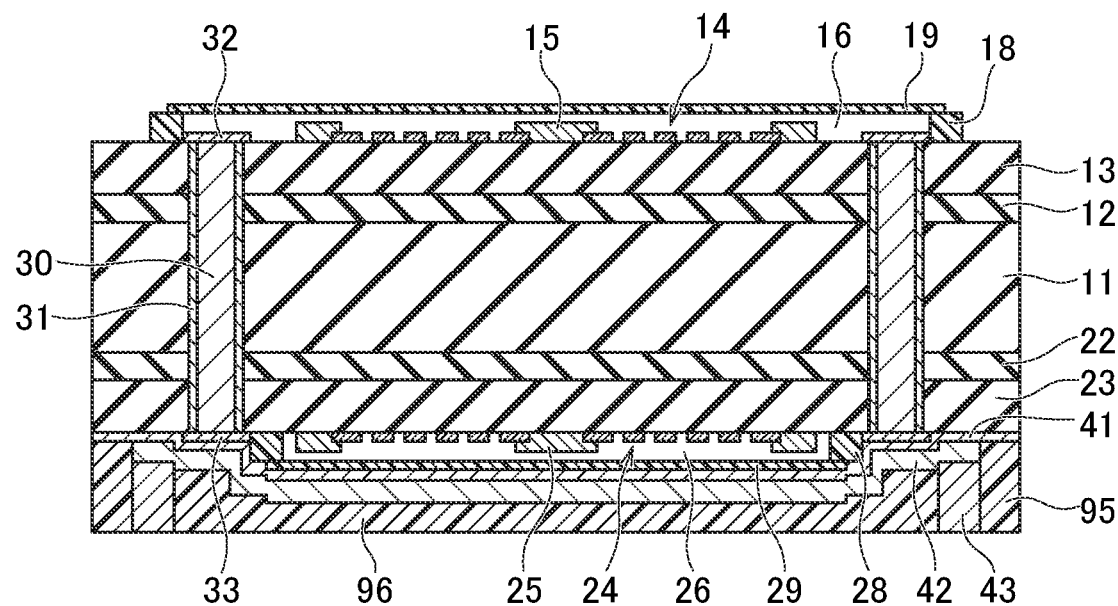
FIG. 10G is a cross-sectional view for describing steps S3D to S3E.

At step S3D, a photolithography process can be applied to the workpiece having the third wiring layer 42 formed corresponding to the pattern of the seventh protection film 95 at step S3C. On the opening area defined in a certain pattern in the seventh protection film 95, the metal layer can be provided (e.g., deposited) to form the third wiring layer 42 on the third seed layer 41. Then, the opening of the seventh protection film 95 can be covered with an eighth protection film 96 to expose the third wiring layer 42 through an opening area corresponding to a column electrode 43 as discussed below. As shown in FIG. 10G, the third seed layer 41 exposed from the third seed layer 42 can be covered with the seventh protection film 95 and the third wiring layer 42 can be covered with the eighth protection film 96. The area corresponding to the column electrode 43 formed on an edge of the third wiring layer 42 can include an opening having a periphery defined by the seventh protection film 95 and the eighth protection film 96, and the third wiring layer 42 is exposed through this opening.

At step S3E, the column electrode 43 can be formed by providing (e.g., depositing) metal on the exposed third wiring layer 42 in the opening having the periphery defined by the seventh protection film 95 and the eighth protection film 96 at step 3D. The metal deposition can be performed by a plating process, and the metal can be copper, for example.

Figure 10H:
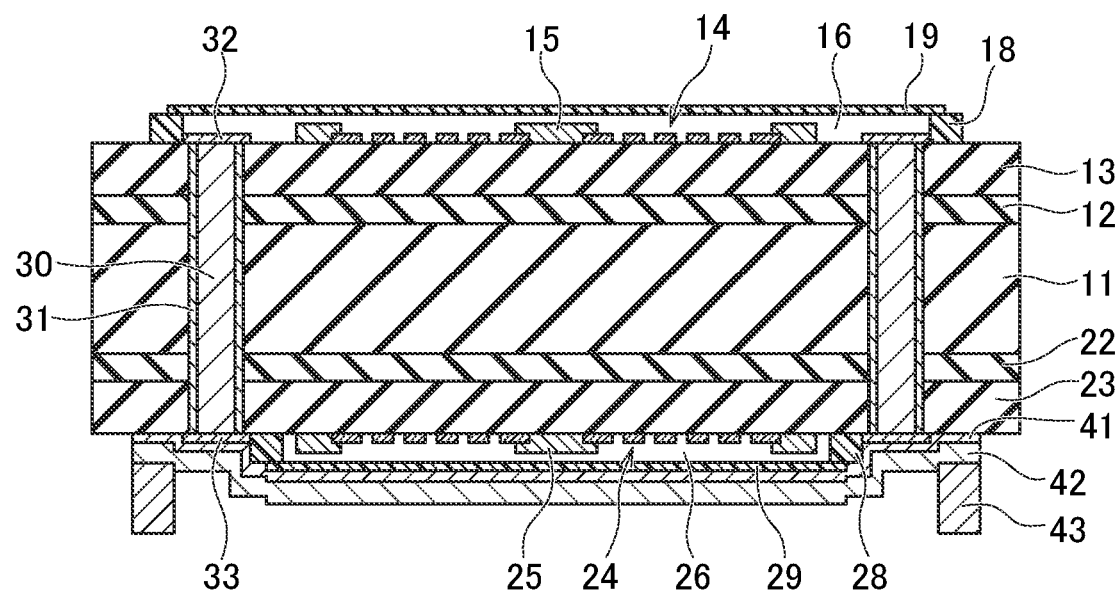
FIG. 10H is a cross-sectional view for describing steps S3F to S3G.

At step S3F, the photoresists of the seventh protection film 95 and the eighth protection film 96 can be removed from the workpiece having the column electrode 43 formed at step S9E. Subsequently, at step S3G, the third seed layer 41 that was uncovered with the third wiring layer 42 and the column electrode 43 and is exposed on the bottom surface of the second piezoelectric layer 23 can be removed by, for example, an etching process. In the workpiece shown in FIG. 10H, the third seed layer 41 that was uncovered with the seventh protection film 95, the eighth protection film 96, and the column electrode 43 and is exposed has been removed.

Figure 10I:
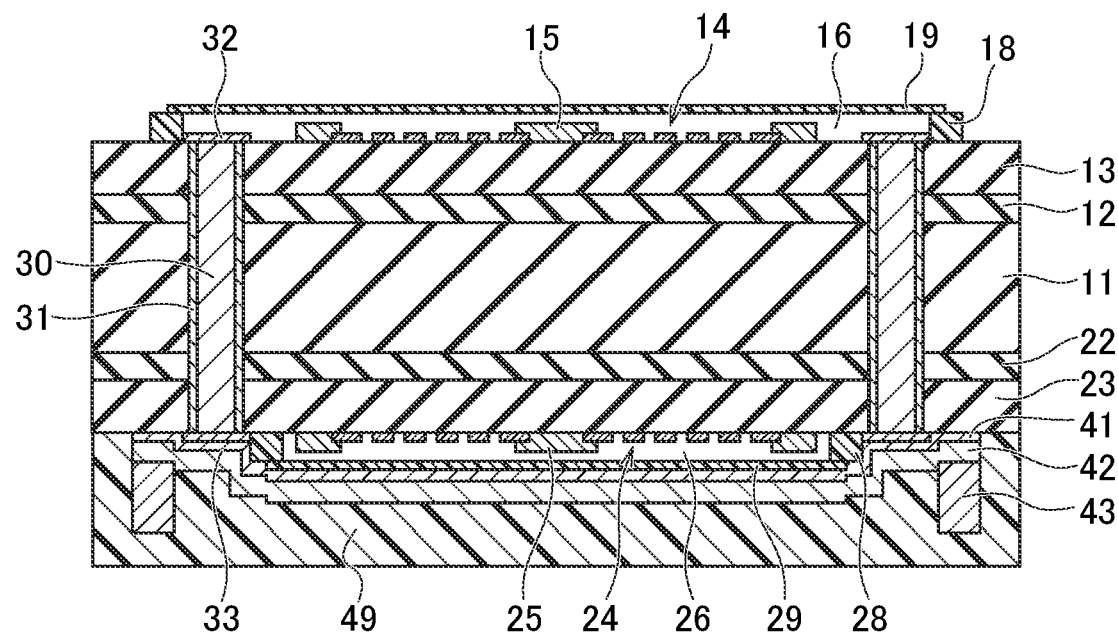
FIG. 10I is a cross-sectional view for describing step S3H.

At step S3H, as shown in FIG. 10I, an encapsulating resin layer 49 can be formed by, for example, a printing process from the bottom surface of the second piezoelectric layer 23 to a certain level to cover and encapsulate the second cavity frame 28, the second cavity roof 29, the third wiring layer 42, the column electrode 43, and the like formed on the bottom surface of the second piezoelectric layer 23 in the workpiece having the third seed layer 41 removed at step S3G.

Figure 10J:
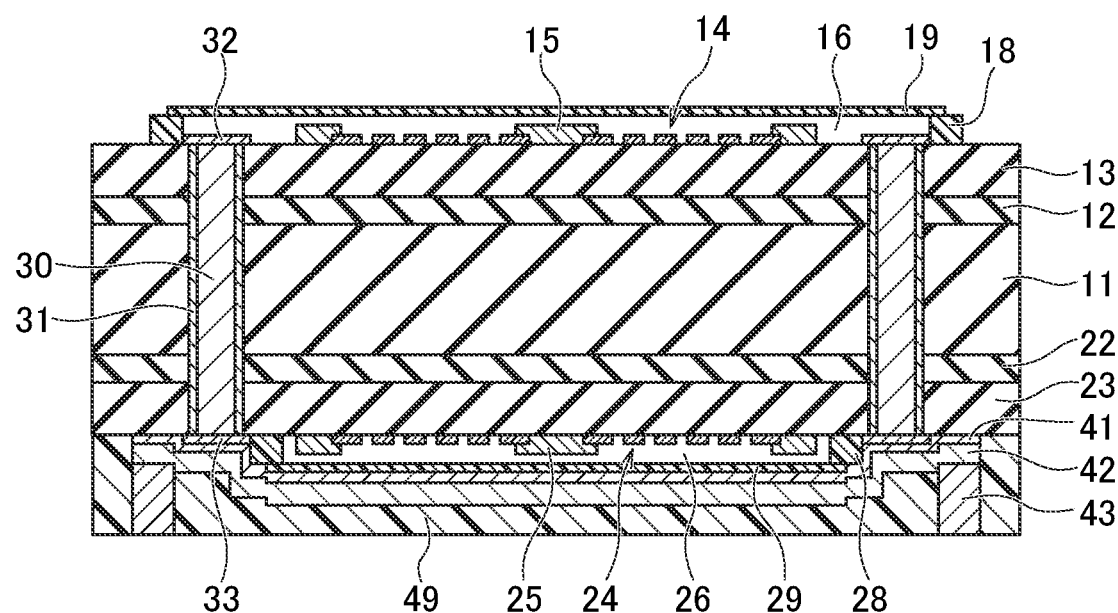
FIG. 10J is a cross-sectional view for describing steps S3I to S3J.

At step S3I, the printed encapsulating resin layer 49 can be cured in the workpiece having the encapsulating resin layer 49 printed on the bottom surface of the second piezoelectric layer 23 at step S3H. At step S3J, the bottom surface of the encapsulating resin layer 49 is ground in the depth direction to be flush with the bottom surfaces of the column electrodes 43 in the workpiece having the encapsulating resin layer 49 cured at step S3I. The workpiece shown in FIG. 10J is depicted to have the bottom surface of the encapsulating resin layer 49 formed flush with the bottom surfaces of the column electrodes 43.

Figure 10K:
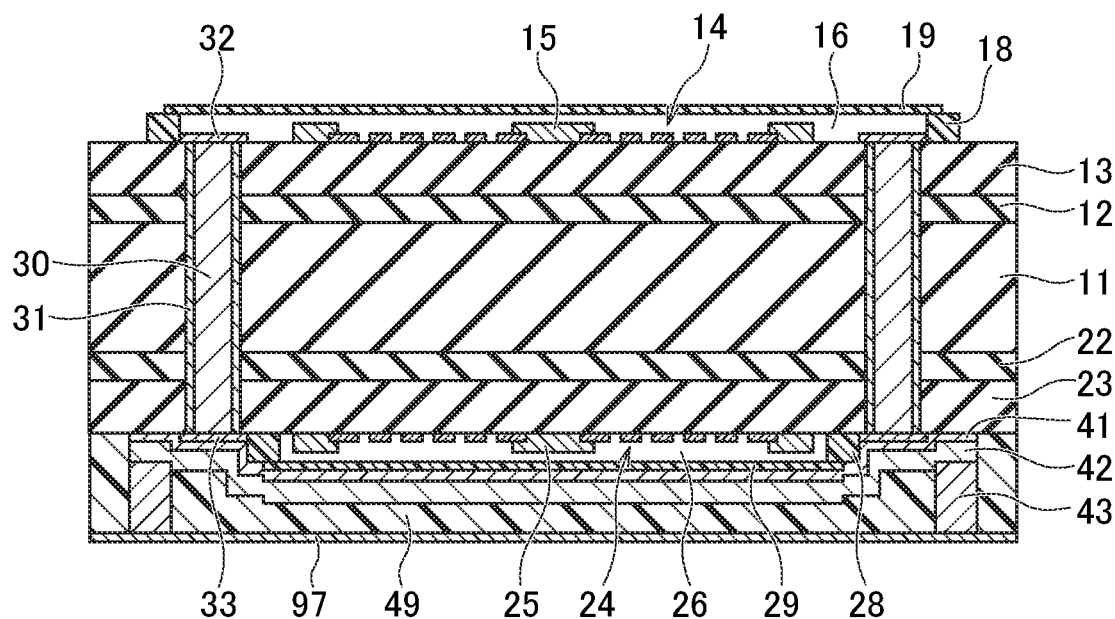
FIG. 10K is a cross-sectional view for describing step S3K.

At step S3K, a fourth seed layer 97 of metal such as copper can be formed by a sputtering process on the bottom surfaces of the column electrodes 43 and the bottom surface of the encapsulating resin layer 49, which have been made flush with each other at step S3J. The workpiece shown in FIG. 10K is depicted to have the fourth seed layer 97 formed on the bottom surfaces of the column electrodes 43 and the bottom surface of the encapsulating resin layer 49.

At step S3L, a ninth protection film 98 of photoresist can be formed to have openings for exposure of areas corresponding to the bottom surfaces of the column electrodes 43 on the fourth seed layer 97, which was formed on the bottom surfaces of the column electrodes 43 and the bottom surface of the encapsulating resin layer 49 at step S3K, and then a photolithography process is applied to the workpiece.

Figure 10L:
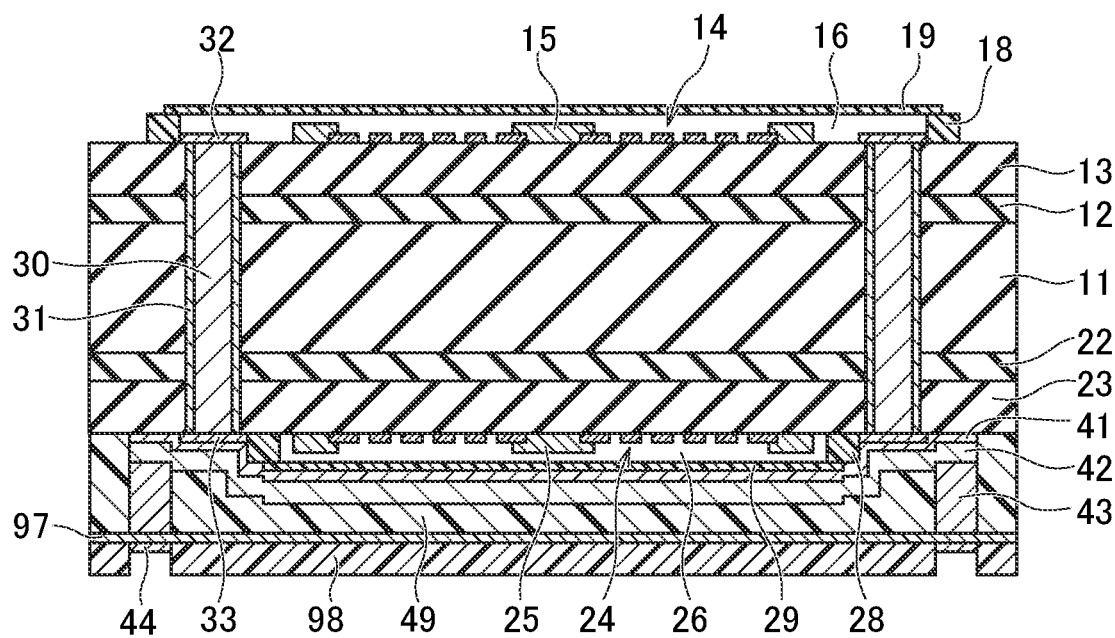
FIG. 10L is a cross-sectional view for describing steps S3L to S3M.

At step S3M, a metal layer such as copper layer can be provided (e.g., deposited) by plating to form a packaging terminal 44 on the fourth seed layer 97 exposed from the ninth protection film 98 in the workpiece having the ninth protection film 98 formed at step S3L. As shown in FIG. 10L, the packaging terminals 44 are formed on the fourth seed layer 97, which is exposed on an opening of the ninth protection film 98.

Figure 10M:
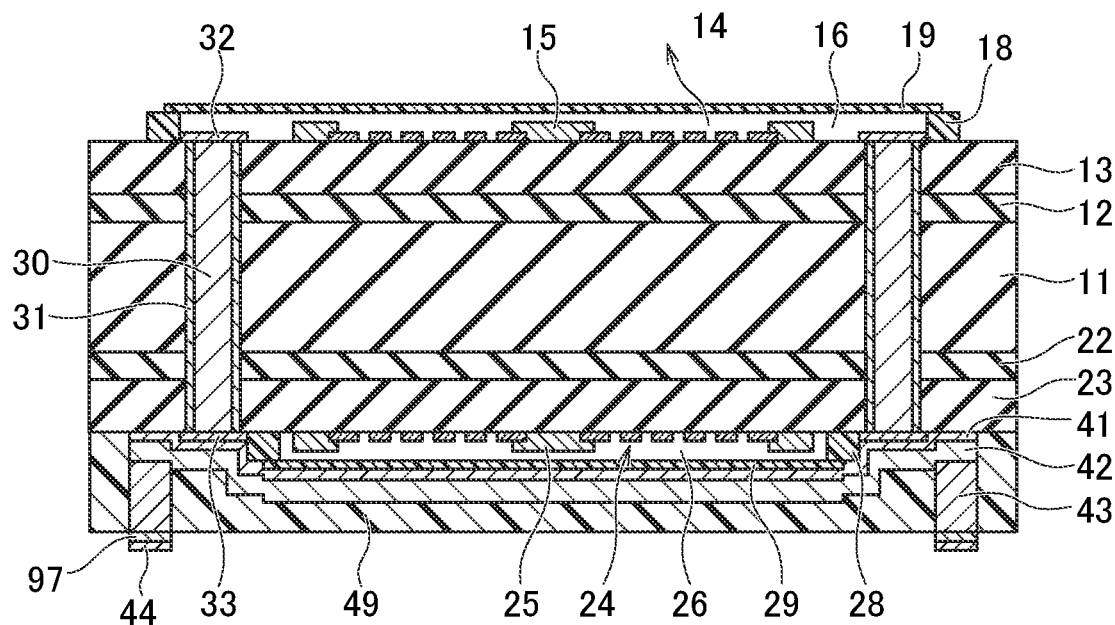
FIG. 10M is a cross-sectional view for describing steps S3N to S3O.

At step S3N, the photoresist of the ninth protection film 98 can be removed from the workpiece having the packaging terminals 44 formed at step S3M. At step S3O, the fourth seed layer 97 that is exposed except for the portions covered with the packaging terminals 44 is removed from the workpiece having the photoresist of the ninth protection film 98 removed at step S3N. As shown in FIG. 10M, the ninth protection film 98 and the fourth seed layer 97 are removed from the bottom surface of the encapsulating resin layer 49 except for the portions of the fourth seed layer 97 covered with the packaging terminals 44.

Figure 10N:
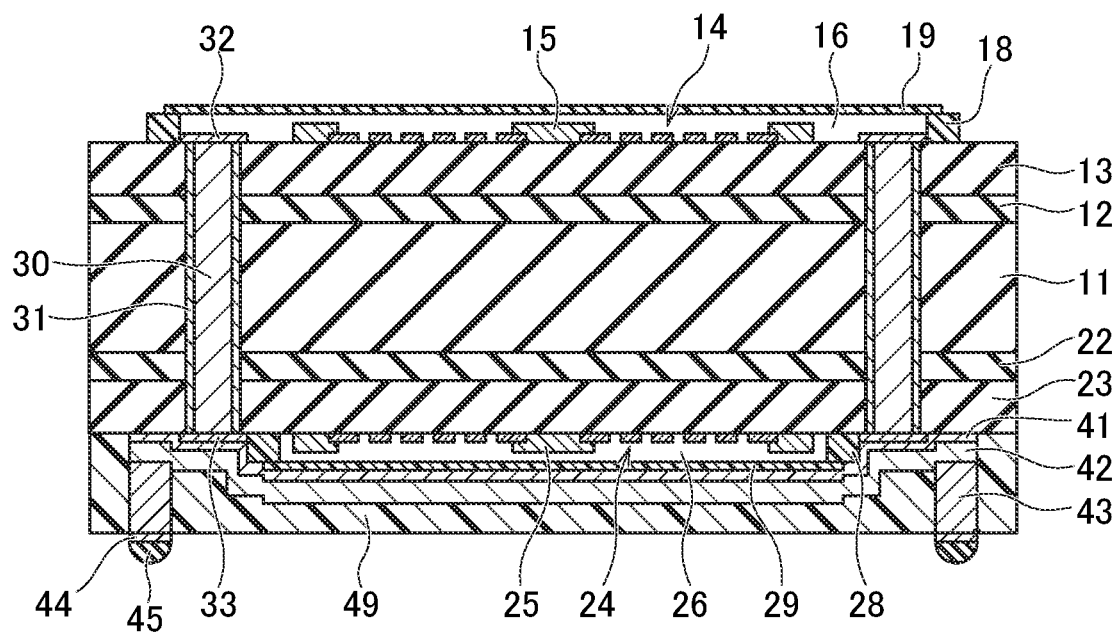
FIG. 10N is a cross-sectional view for describing steps S3P to S3R.
Figure 11A:
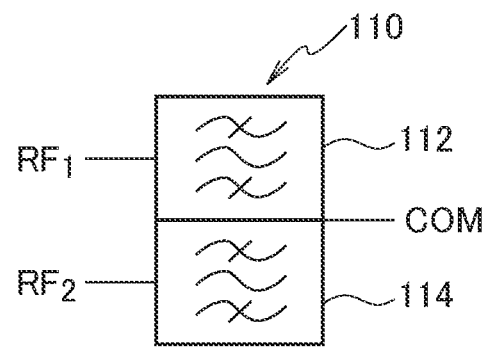
FIG. 11A is a schematic diagram of a duplexer according to an embodiment.

At step S3P, a solder paste is applied to the bottom surfaces of the packaging terminals 44 in the workpiece having the fourth seed layer 97 removed at step S3N except for the portions of the fourth seed layer 97 covered with the packaging terminals 44. At step S3Q, a reflow soldering process is applied to the workpiece in which the solder paste was applied to the bottom surfaces of the packaging terminals 44 at step S3P, and then the melted solder paste is solidified. As a result, solder balls 45 are formed on the bottom surfaces of the packaging terminals 44. The fourth seed layer 97 covered with packaging terminal 44 is absorbed into the packaging terminals 44 via thermal diffusion. At step S3R, a flux is removed from the workpiece having the solder balls 45 formed at step S3Q. As shown in FIG. 10N, the solder balls 45 are formed on the top surfaces of the packaging terminals 44. The configuration shown in FIG. 10N corresponds to the finished SAW filter FIG. 11A is a schematic diagram of a duplexer 110 according to an embodiment. The duplexer 110 includes at least one of the first radio frequency filter and the second radio frequency filter according to the SAW filter embodiments disclosed above. The duplexer 110 includes a first filter 112 and a second filter 114 coupled together at a common node COM. One of the filters in the duplexer 110 can be a transmit filter and the other of the filters in the duplexer 110 can be a receive filter. In some other instances, such as in a diversity receive application, the duplexer 110 can include two receive filters. The common node COM can be an antenna node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like.

Figure 11B:
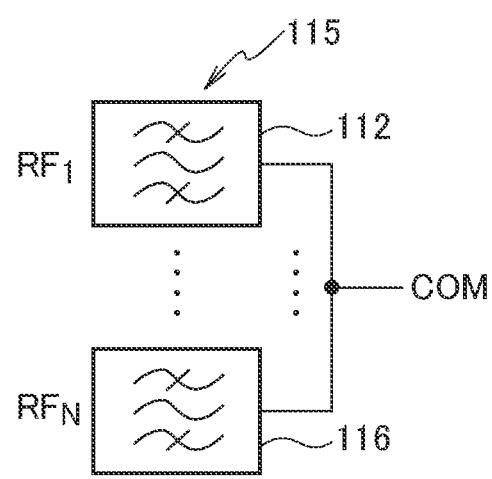
FIG. 11B is a schematic diagram of a multiplexer according to an embodiment.

FIG. 11B is a schematic diagram of a multiplexer according to an embodiment. The multiplexer 115 includes at least one of the first radio frequency filter and the second radio frequency filter according to some embodiments. The multiplexer 115 includes a plurality of filters 112-116 coupled together at a common node COM. The plurality of filters can include any suitable number of filters. For instance, the plurality of filters can include three filters, four filters, five filters, six filters, seven filters, eight filters, or more or less number of filters. Some or all of the plurality of acoustic wave filters can be acoustic wave filters.

The SAW filters discussed herein can be implemented in a variety of packaged modules. Some example packaged modules will now be discussed in which any suitable principles and advantages of the acoustic wave filters and/or acoustic wave resonators discussed herein can be implemented. Example packaged modules may include a package that encloses the illustrated circuit elements. A module including a radio frequency component may be referred to as a radio frequency module. The illustrated circuit elements can be disposed on a common packaging substrate. The packaging substrate can be a laminate substrate, for example. FIGS. 12 to 15 are schematic block diagrams of illustrative packaged modules according to certain embodiments. Any suitable combination of features of these packaged modules can be implemented with each other. While duplexers are illustrated in the example packaged modules of FIGS. 12 to 15, any other suitable multiplexer that includes a plurality of filters coupled to a common node can be implemented instead of one or more duplexers. For instance, a quadplexer can be implemented in certain applications. Alternatively or additionally, one or more filters of a packaged module can be arranged as a transmit filter or a receive filter that is not included in a multiplexer.

Figure 12:
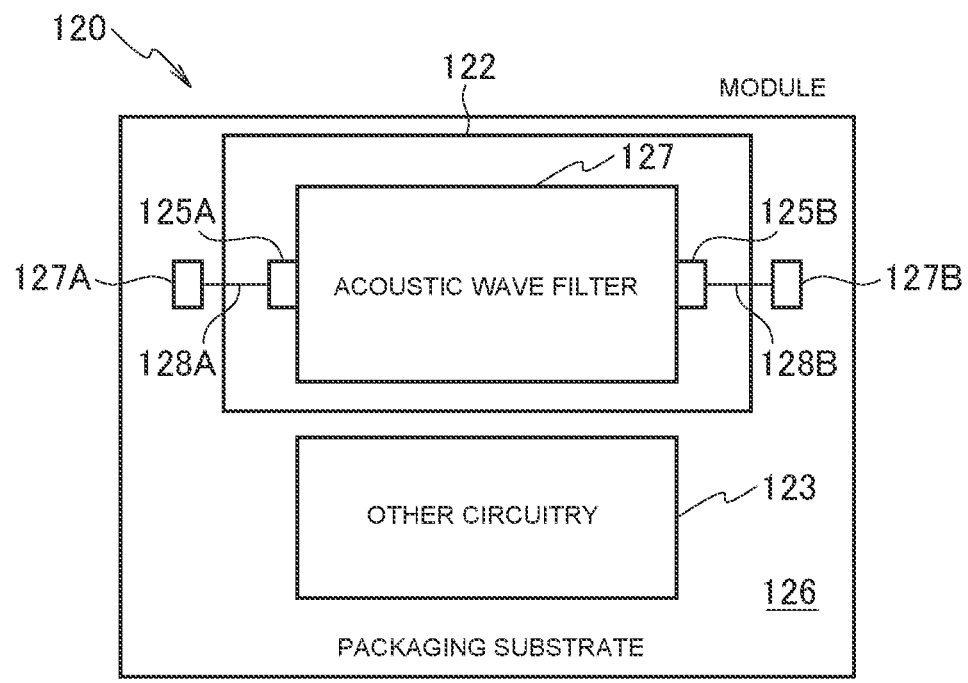
FIG. 12 is a schematic diagram of a radio frequency module according to an embodiment.

FIG. 12 is a schematic diagram of a radio frequency module 120. The radio frequency module 120 includes a SAW filter according to an embodiment. The example radio frequency module 120 includes a SAW component 122 and other circuitry 123. The SAW component 122 includes one or more SAW filters 127 and terminals 125A and 125B. The one or more SAW filters 127 can include at least one of the first radio frequency filter and the second radio frequency filter according to the SAW filter embodiments disclosed above.

The one or more SAW filters 127 include one or more SAW resonators implemented in accordance with any suitable principles and advantages disclosed herein. The terminals 125A and 125B can serve, for example, as an input contact and an output contact. Although two terminals are illustrated, any suitable number of terminals can be implemented for a particular application. The SAW component 122 and the other circuitry 123 are on a common packaging substrate 126 in FIG. 12. The packaging substrate 126 can be a laminate substrate. The terminals 125A and 125B can be electrically connected to contacts 128A and 128B, respectively, on the package substrate 126 by way of electrical connectors 127A and 127B, respectively. The electrical connectors 128A and 128B can be bumps or wire bonds, for example.

The other circuitry 123 can include any suitable additional circuitry. For example, the other circuitry 123 can include one or more power amplifiers, one or more radio frequency switches, one or more additional filters, one or more low noise amplifiers, one or more RF couplers, one or more delay lines, one or more phase shifters, the like, or any suitable combination thereof. The other circuitry 123 can include at least one of the first radio frequency filter and the second radio frequency filter according to the SAW filter embodiments disclosed above. The other circuitry 123 can be electrically connected to the one or more SAW filters 127. The radio frequency module 120 can include one or more packaging structures to, for example, provide protection and/or facilitate easier handling of the radio frequency module 120. Such a packaging structure can include an overmold structure formed over the packaging substrate 126. The overmold structure can encapsulate some or all of the components of the radio frequency module 120.

Figure 13:
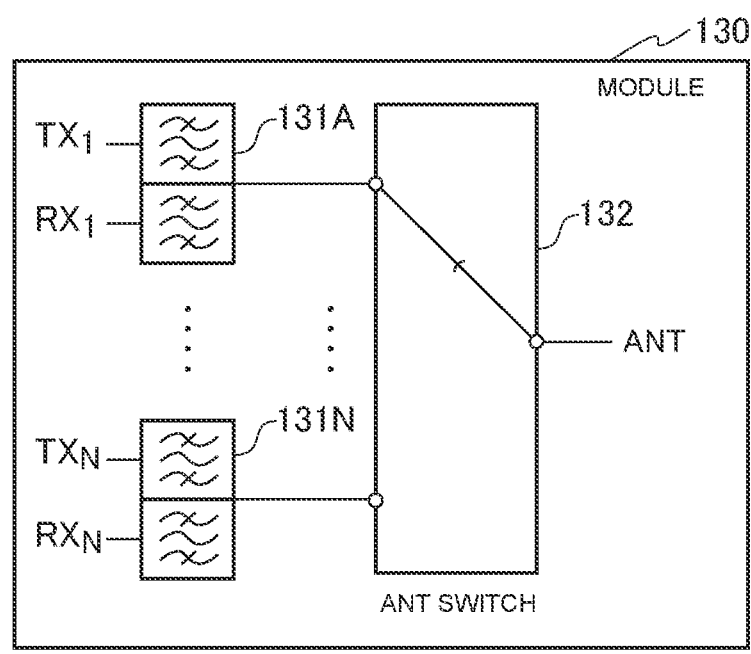
FIG. 13 is a schematic diagram of a radio frequency module according to an embodiment.

FIG. 13 is a schematic block diagram of a radio frequency module 130 that includes duplexers 131A to 131N and an antenna switch 132. One or more filters in the duplexers 131A to 131N can include at least one of the first radio frequency filter and the second radio frequency filter according to the SAW filter embodiments disclosed above. Any suitable number of duplexers 131A to 131N can be implemented. The antenna switch 132 can have a number of throws corresponding to the number of duplexers 131A to 131N. The antenna switch 132 can include one or more additional throws coupled to one or more filters external to the radio frequency module 130 and/or coupled to other circuitry. The antenna switch 132 can electrically couple a selected duplexer to an antenna port of the radio frequency module 130.

Figure 14:
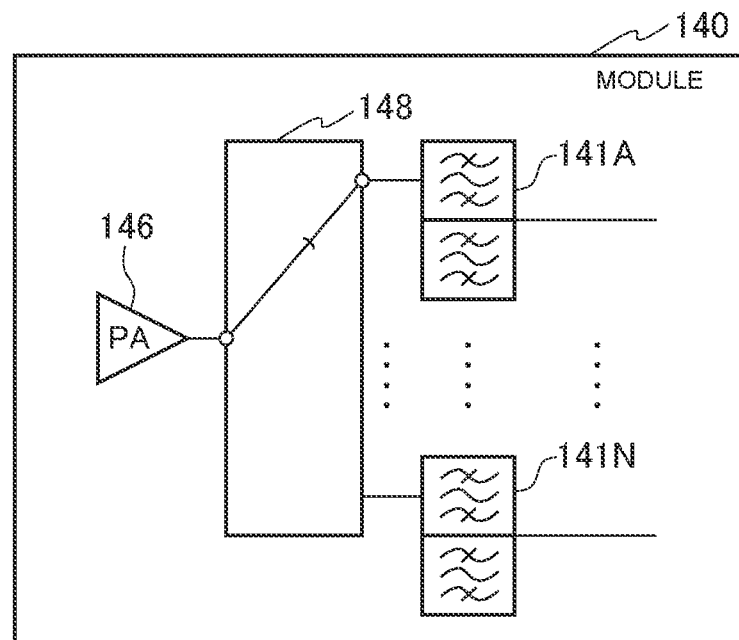
FIG. 14 is a schematic diagram of a radio frequency module according to an embodiment.

FIG. 14 is a schematic block diagram of a radio frequency module 140 that includes a power amplifier 146, a radio frequency switch 148, and duplexers 141A to 141N according to an embodiment. The power amplifier 146 can amplify a radio frequency signal. The radio frequency switch 148 can be a multi-throw radio frequency switch. The radio frequency switch 148 can electrically couple an output of the power amplifier 146 to a selected transmit filter of the duplexers 141A to 141N. One or more filters in the duplexers 141A to 141N can include at least one of the first radio frequency filter and the second radio frequency filter according to the SAW filter embodiments disclosed above. Any suitable number of duplexers 141A to 141N can be implemented.

Figure 15:
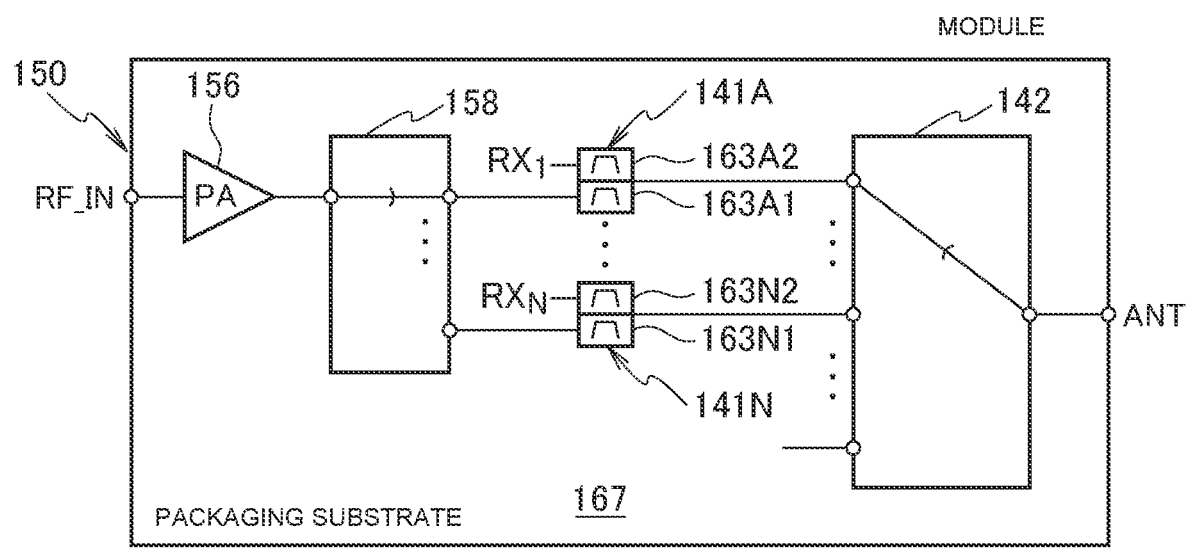
FIG. 15 is a schematic diagram of a radio frequency module according to an embodiment.

FIG. 15 is a schematic diagram of a radio frequency module 150 that includes a SWA filter according to an embodiment. As illustrated, the radio frequency module 150 includes duplexers 141A to 141N that include respective transmit filters 163A1 to 163N1 and respective receive filters 163A2 to 163N2, a power amplifier 156, a select switch 158, and an antenna switch 142. The radio frequency module 150 can include a package that encloses the illustrated elements. The illustrated elements can be disposed on a common package substrate 167. The packaging substrate 167 can be a laminate substrate, for example. The radio frequency module 150 that includes a power amplifier 156 can be referred to as a power amplifier module. The radio frequency module 150 can include a subset of the elements illustrated in FIG. 13 and/or additional elements. The radio frequency module 150 can include at least one of the first radio frequency filter and the second radio frequency filter according to the SAW filter embodiments disclosed above.

The duplexers 141A to 141N can each include two SAW filters coupled to a common node. For instance, the two SAW filters can be a transmit filter and a receive filter. As illustrated, the transmit filter and the receive filter can each be a band pass filter arranged to filter a radio frequency signal. The one or more transmit filters 163A1 to 163N1 can include at least one of the first radio frequency filter and the second radio frequency filter according to the SAW filter embodiments disclosed above. The one or more receive filters 163A2 to 163N2 can include at least one of the first radio frequency filter and the second radio frequency filter according to the SAW filter embodiments disclosed above. Although FIG. 13 illustrates duplexers, any suitable principles and advantages disclosed herein can be implemented in other multiplexers (e.g., quadplexers, hexaplexers, octoplexers, etc.) and/or in switch-plexers.

The power amplifier 156 can amplify a radio frequency signal. The illustrated switch 158 is a multi-throw radio frequency switch. The switch 158 can electrically couple an output of the power amplifier 156 to a selected transmit filter of the transmit filters 163A1 to 163N1. In some instances, the switch 158 can electrically connect the output of the power amplifier 156 to more than one of the transmit filters 163A1 to 163N1. The antenna switch 142 can selectively couple a signal from one or more of the duplexers 141A to 141N to an antenna port ANT. The duplexers 141A to 141N can be associated with different frequency bands and/or different modes of operation (e.g., different power modes, different signaling modes, etc.).

Figure 16A:
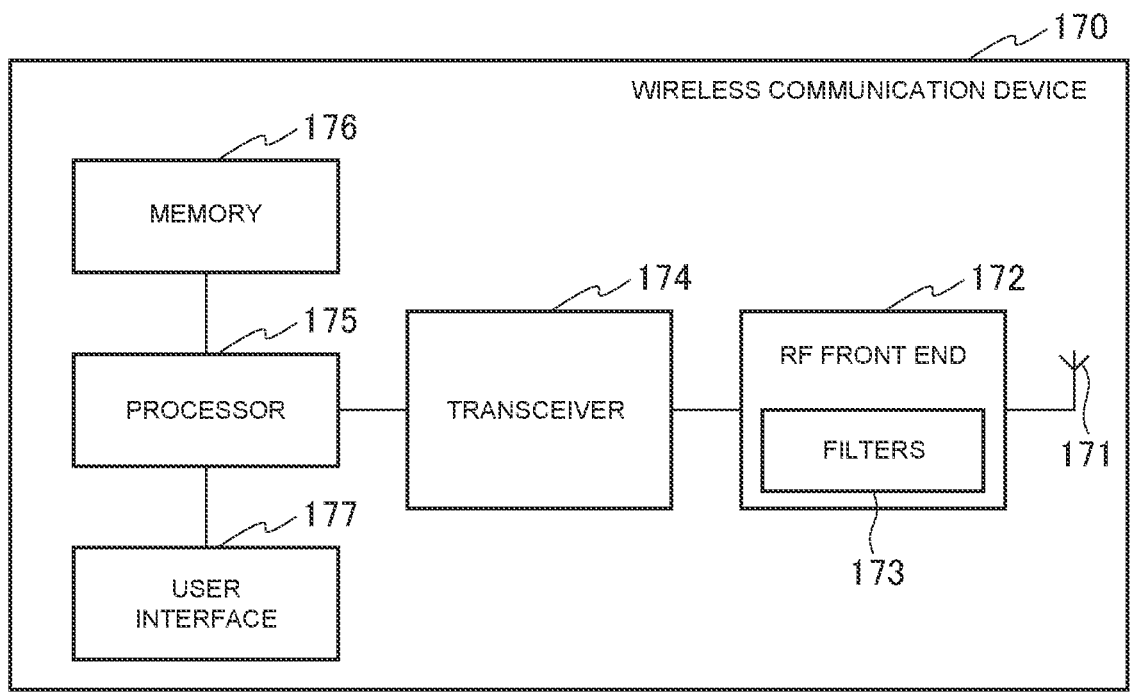
FIG. 16A is a schematic diagram of a wireless communication device according to an embodiment.

The SAW filters disclosed herein can be implemented in a variety of wireless communication devices. FIG. 16A is a schematic diagram of a wireless communication device 170 that includes filters 173 in a radio frequency (RF) front end 172 according to an embodiment. One or more of the filters 173 can include at least one of the first radio frequency filter and the second radio frequency filter according to the SAW filter embodiments disclosed above. The wireless communication device 170 can be any suitable wireless communication device. For instance, a wireless communication device 170 can be a mobile phone such as a smart phone. As illustrated, the wireless communication device 170 includes an antenna 171, an RF front end 172, a transceiver 174, a processor 175, a memory 176, and a user interface 177. The antenna 171 can transmit RF signals provided by the RF front end 172. Such RF signals can include carrier aggregation signals. The antenna 171 can receive RF signals and provide the received RF signals to the RF front end 172 for processing. Such RF signals can include carrier aggregation signals. The wireless communication device 170 can include two or more antennas in certain instances.

The RF front end 172 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 172 can transmit and receive RF signals associated with any suitable communication standards. One or more of the filters 173 can include a SAW filter that includes any suitable combination of features of the embodiments disclosed above.

The transceiver 174 can provide RF signals to the RF front end 172 for amplification and/or other processing. The transceiver 174 can also process an RF signal provided by a low noise amplifier of the RF front end 172. The transceiver 174 is in communication with the processor 175. The processor 175 can be a baseband processor. The processor 175 can provide any suitable baseband processing functions for the wireless communication device 170. The memory 176 can be accessed by the processor 175. The memory 176 can store any suitable data for the wireless communication device 170. The user interface 177 can be any suitable user interface, such as a display with touch screen capabilities.

Figure 16B:
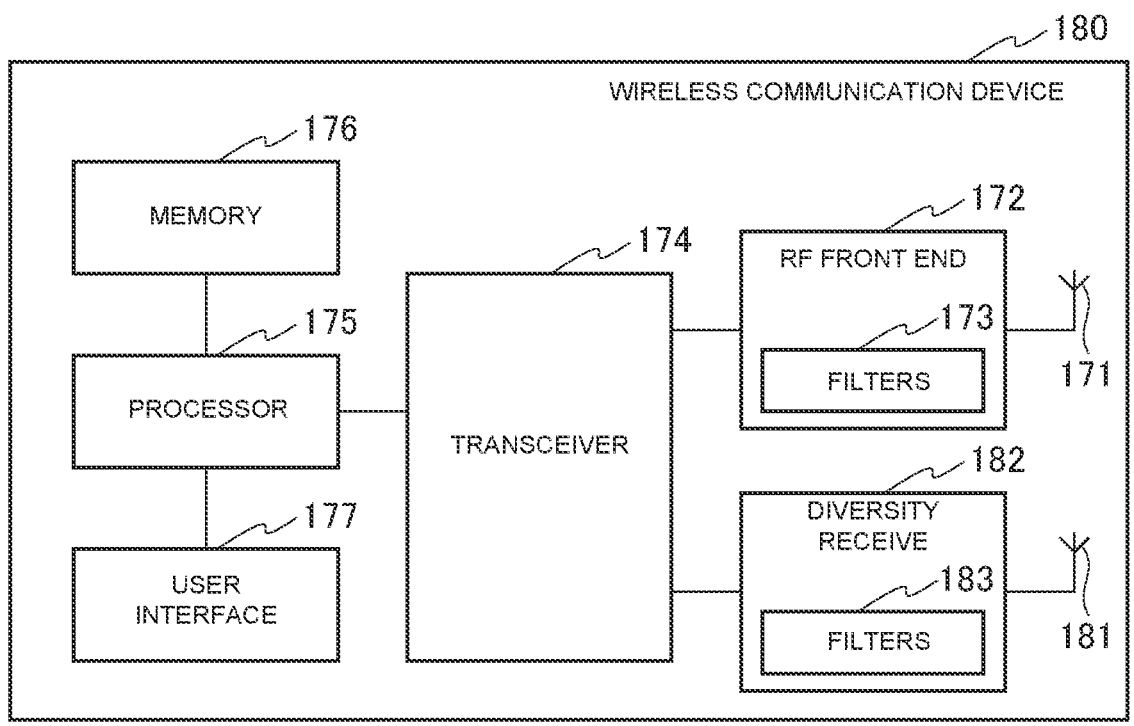
FIG. 16B is a schematic diagram of a wireless communication device according to an embodiment.

FIG. 16B is a schematic diagram of a wireless communication device 180 that includes filters 173 in a radio frequency front end 172 and second filters 183 in a diversity receive module 182. The wireless communication device 180 is like the wireless communication device 170 of FIG. 14A, except that the wireless communication device 180 also includes diversity receive features. As illustrated in FIG. 16B, the wireless communication device 180 includes a diversity antenna 181, a diversity module 182 configured to process signals received by the diversity antenna 181 and including filters 183, and a transceiver 174 in communication with both the radio frequency front end 172 and the diversity receive module 182. One or more of the second filters 183 can include at least one of the first radio frequency filter and the second radio frequency filter according to the SAW filter embodiments disclosed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexers, devices, modules, wireless communication devices, apparatus, methods, and systems described herein may be embodied in a variety of other forms. Furthermore, various omissions, substitutions and changes in the form of the resonators, filters, multiplexers, devices, modules, wireless communication devices, apparatus, methods and systems described herein may be made without departing from the spirit of the disclosure. For example, while blocks are presented in a given arrangement, alternative embodiments may perform similar functionalities with different components and/or

What is claimed is:

1. A method of manufacturing a surface acoustic wave filter, the method comprising:
   providing a substrate;
   disposing a first piezoelectric layer and a second piezoelectric layer on a first main surface of the substrate and a second main surface of the substrate opposing the first main surface, respectively;
   forming a plurality of first surface acoustic wave resonators and a plurality of second surface acoustic wave resonators on a top surface of the first piezoelectric layer and a bottom surface of the second piezoelectric layer, respectively;
   forming a first wiring layer and a second wiring layer on the top surface of the first piezoelectric layer and the bottom surface of the second piezoelectric layer, respectively, the first wiring layer connecting the plurality of first surface acoustic wave resonators to each other and the second wiring layer connecting the plurality of second surface acoustic wave resonators to each other;
   forming a plurality of through electrodes extending through the substrate, the first piezoelectric layer, and the second piezoelectric layer, the plurality of through electrodes include a through electrode connected to the first wiring layer and/or the second wiring layer; and
   forming respective cavities over the plurality of first surface acoustic wave resonators, the first wiring layer, and the plurality of through electrodes on the top surface of the first piezoelectric layer and over the plurality of second surface acoustic wave resonators, the second wiring layer, and the plurality of through electrodes on the bottom surface of the second piezoelectric layer, a circuit including the plurality of first surface acoustic wave resonators and the first wiring layer on the top surface of the first piezoelectric layer forming at least one first radio frequency filter, a circuit including the plurality of second surface acoustic wave resonators and the second wiring layer on the bottom surface of the second piezoelectric layer forming at least one second radio frequency filter, the at least one first radio frequency filter and the at least one second radio frequency filter belonging to different frequency bands.

2. The method of claim 1 further comprising forming respective dielectric layers on the first main surface and the second main surface of the substrate before disposing the first piezoelectric layer and the second piezoelectric layer on the first main surface and the second main surface, respectively, forming the plurality of through electrodes including forming the plurality of through electrodes to extend through the respective dielectric layers.

3. The method of claim 1 wherein forming the respective cavities includes:
   forming a first cavity roof and a second cavity roof covering the respective cavities on the top surface of the first piezoelectric layer and the bottom surface of the second piezoelectric layer, respectively;
   forming another second wiring layer formed on the bottom surfaces of the second piezoelectric layer and the second cavity roof to connect at least some of the plurality of through electrodes to each other;
   forming a resin layer covering the other second wiring layer on the bottom surfaces of the second piezoelectric layer and the second cavity roof; and
   forming a packaging terminal on a bottom surface of the resin layer to be connected to the other second wiring layer.

4. The method of claim 3 wherein forming the first cavity roof includes:
   forming a first cavity frame on the top surface of the first piezoelectric layer, the first cavity frame having a certain height and extending along a periphery of the substrate to surround the plurality of first surface acoustic wave resonators, the first wiring layer, and the plurality of through electrodes; and
   disposing the first cavity roof to be supported by the first cavity frame.

5. The method of claim 4 wherein forming the second cavity roof further includes:
   forming a second cavity frame on the bottom surface of the second piezoelectric layer, the second cavity frame having a certain height and extending along a periphery of the substrate to surround the plurality of second surface acoustic wave resonators, the second wiring layer, and the plurality of through electrodes; and
   disposing the second cavity roof to be supported by the second cavity frame.

6. The method of claim 5 further comprising forming another seed layer to be connected to at least some of the plurality of through electrodes on the bottom surface of the second piezoelectric layer to cover the second cavity roof, before forming the other second wiring layer, the other second wiring layer being formed on the other seed layer.

7. The method of claim 3 further comprising forming a column electrode to be connected to the other second wiring layer through the resin layer, before forming the resin layer, the packaging terminal being formed on an end face of the column electrode.

8. The method of claim 1 wherein forming the plurality of through electrodes include forming a number of through electrodes adjacently disposed together as a single unit.

9. The method of claim 1 further comprising forming second interdigital transducer electrodes associated with the second piezoelectric layer, and a second cavity frame over the second piezoelectric layer, the second cavity frame laterally surrounding the second interdigital transducer electrodes.

10. The method of claim 1 wherein the plurality of through electrodes include a through electrode electrically isolated from the first wiring layer and/or the second wiring layer.

11. A surface acoustic wave filter assembly comprising:
    a first surface acoustic wave filter connected to a common node; and
    a second surface acoustic wave filter connected to the common node, at least one of the first surface acoustic wave filter and the second surface acoustic wave filter includes a surface acoustic wave filter manufactured using the method of claim 1.

12. A method of manufacturing a packaged surface acoustic wave filter chip, the method comprising:
    providing a structure having first interdigital transducer electrodes formed with a first piezoelectric layer, second interdigital transducer electrodes formed with a second piezoelectric layer, and a substrate between the first and second piezoelectric layers;

forming a first cavity frame over the first piezoelectric layer, the first cavity frame laterally surrounding the first interdigital transducer electrodes;

forming a first roof over the first cavity frame to define a first cavity between the first piezoelectric layer and the first roof;

forming a second cavity frame over the second piezoelectric layer, the second cavity frame laterally surrounding the second interdigital transducer electrodes;

and forming a second roof over the second cavity frame to define a second cavity between the first piezoelectric layer and the second roof; and forming a plurality of through electrodes extending at least partially through a thickness of the structure such that a first set of through electrodes of the plurality of through electrodes are electrically connected to the first interdigital transducer electrodes and a second set of through electrodes of the plurality of through electrodes are electrically isolated from the first interdigital transducer electrodes.

13. The method of claim 12 forming a plurality of first surface acoustic wave resonators and a plurality of second surface acoustic wave resonators on a top surface of the first piezoelectric layer and a bottom surface of the second piezoelectric layer.

14. The method of claim 13 wherein forming the first cavity frame forms the first cavity frame to extend along a periphery of the substrate to surround the plurality of first surface acoustic wave resonators.

15. The method of claim 14 wherein forming the second cavity frame over the second piezoelectric layer forms the second cavity frame to extend along a periphery of the substrate to surround the plurality of second surface acoustic wave resonators.

16. The method of claim 12 further comprising providing an encapsulation layer over the second roof.

17. The method of claim 16 further comprising forming a conductive via at least partially through the encapsulation layer.

18. The method of claim 17 further comprising forming a terminal over the conductive via, the terminal electrically connected to the first interdigital transducer electrodes at least partially through the first set of through electrodes and the conductive via.

19. The method of claim 12 wherein a thickness of the first piezoelectric layer is different from a thickness of the second piezoelectric layer.

20. The method of claim 12 wherein the first interdigital transducer electrodes define a first surface acoustic wave filter belonging to a first frequency band and the second interdigital transducer electrodes define a second surface acoustic wave filter belonging to a second frequency band.

* * * * *